(12) United States Patent
Holland et al.

(10) Patent No.: US 10,978,437 B2
(45) Date of Patent: Apr. 13, 2021

(54) ANALOG-MIXED SIGNAL CIRCUIT CELLS WITH UNIVERSAL FIN PITCH AND POLY PITCH

(71) Applicant: QUALCOMM Incorporated, San Diego, CA (US)

(72) Inventors: Jonathan Holland, Cary, NC (US); Jeffrey Charles Lee, Cary, NC (US); Chulkyu Lee, San Diego, CA (US); Harikrishna Chintarlapalli Reddy, Bengaluru (IN)

(73) Assignee: QUALCOMM INCORPORATED, San Diego, CA (US)

( * ) Notice: Subject to any disclaimer, the term of this patent is extended or adjusted under 35 U.S.C. 154(b) by 32 days.

(21) Appl. No.: 16/456,311

(22) Filed: Jun. 28, 2019

(65) Prior Publication Data
US 2020/0411500 A1 Dec. 31, 2020

(51) Int. Cl.
*H01L 27/02* (2006.01)
*H01L 27/06* (2006.01)
*H01L 23/528* (2006.01)
*H03K 17/687* (2006.01)
*H03F 3/45* (2006.01)
*H01L 29/78* (2006.01)
*H01L 49/02* (2006.01)

(52) U.S. Cl.
CPC ........ *H01L 27/0207* (2013.01); *H01L 23/528* (2013.01); *H01L 27/0629* (2013.01); *H03K 17/687* (2013.01); *H01L 28/20* (2013.01); *H01L 28/40* (2013.01); *H01L 29/785* (2013.01); *H03F 3/45179* (2013.01)

(58) Field of Classification Search
CPC .............. H01L 29/785; H01L 29/7831; H01L 27/0207; H01L 27/0629; H01L 23/528; H01L 28/20; H01L 28/40
See application file for complete search history.

(56) References Cited

U.S. PATENT DOCUMENTS

2010/0287518 A1* 11/2010 Becker ................. G06F 30/392
716/123
2015/0171217 A1* 6/2015 Kim ................ H01L 21/823431
257/401

* cited by examiner

Primary Examiner — Quoc D Hoang
(74) Attorney, Agent, or Firm — Chui-Kiu T. Wong

(57) ABSTRACT

An integrated circuit, comprising a transistor-based cell comprising a set of fin field effect transistors (Fin FETs) chained together in a first direction, wherein the set of Fin FETs include fins extending longitudinally along the first direction and equally-spaced apart in a second direction orthogonal to the first direction by a fin pitch, and a set of polysilicon gates extending longitudinally along the second direction and equally-spaced apart in the first direction by a poly pitch, wherein a first dimension of the transistor-based cell along the first direction is substantially a first integer multiplied by the poly pitch, and wherein a second dimension of the transistor-based cell along the second direction is substantially a second integer multiplied by the fin pitch. The integrated circuit may include other non-transistor-based cells (e.g., passive cells), such as thin-film resistor or capacitor cells, which are arranged in a two-dimensional array with the transistor-based cell.

24 Claims, 21 Drawing Sheets

FIG. 16C

Structure 1665:

| | | | | | | | | | |
|---|---|---|---|---|---|---|---|---|---|
| TCC | EC | EC | EC | BCC | TCC | EC | EC | EC | BCC |
| | D 1x4 | D 1x4 | D 2x4 | | | D 3x4 | D 1x4 | D 1x4 | |
| TOP CAP | PFET 1x16 | PFET 1x16 | PFET 2x16 | BOTTOM CAP | TOP CAP | NFET 3x16 | NFET 1x16 | NFET 1x16 | BOTTOM CAP |
| | | | | | | | NFET 1x8 | NFET 1x8 | |
| | | | | | | | NFET 1x8 | NFET 1x8 | |
| TOP CAP | PFET 1x16 | PFET 1x16 | PFET 2x16 | BOTTOM CAP | TOP CAP | NFET 3x16 | NFET 1x16 | NFET 1x16 | BOTTOM CAP |
| | D 1x4 | D 1x4 | D 2x4 | | | D 3x4 | D 1x4 | D 1x4 | |
| TCC | EC | EC | EC | BCC | TCC | EC | EC | EC | BCC |

Structure 1670:

| | | | | |
|---|---|---|---|---|
| TCC | EC or DC | EC | EC or DC | BCC |
| TOP CAP | PASSIVE CELL 4 X 16 | PASSIVE CELL 3 X 16 | PASSIVE CELL 4 X 16 | BOTTOM CAP |
| TCC | EC or DC | EC or DC | EC or DC | BCC |

ANALOG-MIXED SIGNAL CIRCUIT CELLS WITH UNIVERSAL FIN PITCH AND POLY PITCH

FIELD

Aspects of the present disclosure relate generally to integrated circuit (IC) layouts, and in particular, to an IC layout having analog-mixed signal circuits with heights based on an integer multiple of a fin pitch and width based on an integer multiple of a poly pitch.

BACKGROUND

An integrated circuit (IC), such as a system on chip (SOC), typically includes a centralized digital core, and an analog-mixed signal (AMS) circuit section along the periphery of the IC. Generally, the digital core, which may include memory circuits, a central processing unit (CPU), a graphics processing unit (GPU), digital signal processing (e.g., modem), and other digital circuits, are laid out neatly in a two-dimensional array. However, the AMS circuit section often has custom layouts due to different length and width devices, and other variable features, leading to often an irregular layout. As technology nodes become smaller, the irregular layout of the AMS circuit section may lead to issues that may adversely impact manufacturing yields and performance (as well as integrating with top-level metallization, circuitry, pads, and other IC features).

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an integrated circuit, comprising a transistor-based cell comprising a set of fin field effect transistors (Fin FETs) chained together in a first direction, wherein the set of Fin FETs include fins extending longitudinally along the first direction and equally-spaced apart in a second direction orthogonal to the first direction by a fin pitch, and a set of polysilicon gates extending longitudinally along the second direction and equally-spaced apart in the first direction by a poly pitch, wherein a first dimension of the transistor-based cell along the first direction is substantially a first integer multiplied by the poly pitch, and wherein a second dimension of the transistor-based cell along the second direction is substantially a second integer multiplied by the fin pitch; and a passive-device based cell including a passive device, wherein a third dimension of the passive-based cell along the first direction is substantially a third integer multiplied by the poly pitch, and wherein a fourth dimension of the passive-based cell along the second direction is substantially a fourth integer multiplied by the fin pitch.

Another aspect of the disclosure relates to an integrated circuit, comprising a first row of transistor-based cells extending in a first direction, wherein each of the transistor-based cells includes a set of fin field effect transistors (Fin FETs) chained together in the first direction, wherein the set of Fin FETs include fins extending longitudinally in the first direction and equally-spaced apart in a second direction orthogonal to the first direction by a fin pitch, and a set of polysilicon gates extending longitudinally in the second direction and equally-spaced apart in the first direction by a poly pitch, wherein a first dimension of each of the transistor-based cells in the first direction is substantially a first integer multiplied by the poly pitch, and wherein a second dimension of each of the transistor-based cells in the second direction is substantially a second integer multiplied by the fin pitch.

Another aspect of the disclosure relates to an integrated circuit, comprising a two-dimensional array of transistor-based cells arranged in stack of rows with opposite ends substantially aligned in a first direction, wherein each of the transistor-based cells comprises a set of fin field effect transistors (Fin FETs) chained together in a second direction orthogonal to the first direction, wherein the set of Fin FETs include fins extending longitudinally in the second direction and equally-spaced apart in the first direction by a fin pitch, and polysilicon gates extending longitudinally in the first direction and equally-spaced apart in the second direction by a poly pitch, wherein a first dimension of each of the transistor-based cells in the first direction is substantially a first integer multiplied by the fin pitch, and wherein a second dimension of each of the transistor-based cells along the second direction is substantially a second integer multiplied by the poly pitch.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

BRIEF DESCRIPTION OF THE DRAWINGS

FIG. 16B-16C illustrate top layout views of exemplary circuits including an array of transistor-based cells juxtaposed with an array of passive cells in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
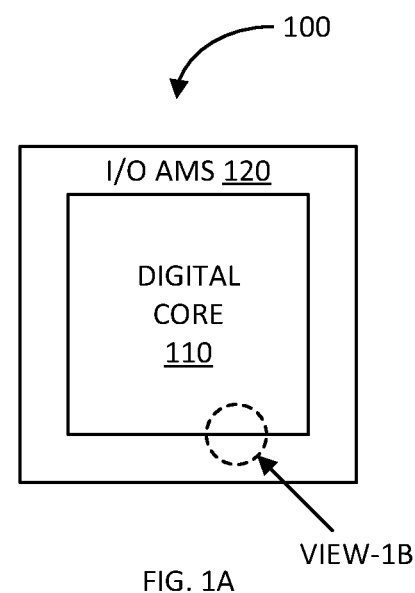
FIG. 1A illustrates a top layout view of an exemplary system-on-chip (SOC) integrated circuit (IC) in accordance with an aspect of the disclosure.

FIG. 1A illustrates a top layout view of an exemplary system-on-chip (SOC) integrated circuit (IC) 100 in accordance with an aspect of the disclosure. The SOC IC 100 includes a digital core 110 and an input/output (I/O) analog-mixed signal (AMS) portion 120. Typically, the digital core 110 is located centrally within the SOC IC 100, and the I/O AMS portion 120 is located along the periphery of the SOC IC 100.

The digital core 110 generally performs the various intended digital operations of the SOC IC 100 (e.g., general digital processing, graphics processing, digital signal processing (DSP), data storage, etc.). The I/O AMS portion 120 typically interfaces the digital core 110 to one or more devices external to the SOC IC 100. Such interface operations include converting signals between digital and analog signals, level shifting analog signals, amplifying analog signals, and others.

Figure 1B:
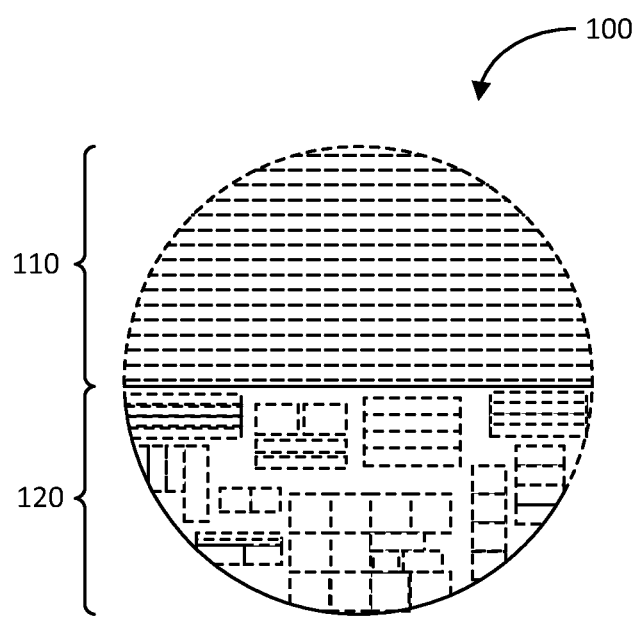
FIG. 1B illustrates a top layout blow-up view of a portion of the exemplary SOC IC of FIG. 1A in accordance with another aspect of the disclosure.

FIG. 1B illustrates a top layout blow-up view of a portion of the exemplary SOC IC 100 in accordance with another aspect of the disclosure. The portion of the SOC IC 100 depicted is the boundary between the digital core 110 and the I/O AMS portion 120. As represented by dash lines, the digital core 110 typically includes a set of digital circuit cells neatly arranged in a two-dimensional array (e.g., rows and columns). The two-dimensional arrangement of the digital circuit cells typically leads to high manufacturing yields.

In contrast, the I/O AMS portion 120 of the SOC IC 100 includes AMS circuit cells that are more varied than the digital circuit cells of the digital core 110. As depicted, the AMS circuit cells typically have mixed device lengths between active devices and passive devices. Typically, the layout of the AMS circuit cells are a mix of full- and semi-custom layouts. They further have non-standardized row/column structure. Additionally, foundries are now trying to get away from using thick-oxide I/O devices in AMS circuits, and using newer technology devices (e.g., Fin FETs) with thinner-oxide and much higher speed operations.

Figure 2A:
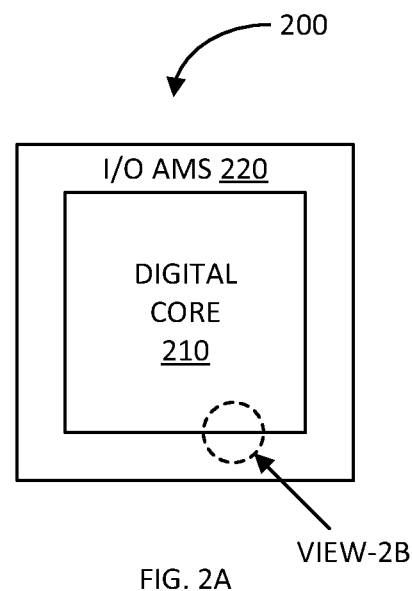
FIG. 2A illustrates a top layout view of another exemplary SOC IC in accordance with another aspect of the disclosure.

FIG. 2A illustrates a top view of another exemplary SOC IC 200 in accordance with another aspect of the disclosure. Similar to SOC IC 100, the SOC IC 200 includes a centrally-located digital core 210 and an I/O AMS portion 220 along the periphery of the SOC IC 200.

Figure 2B:
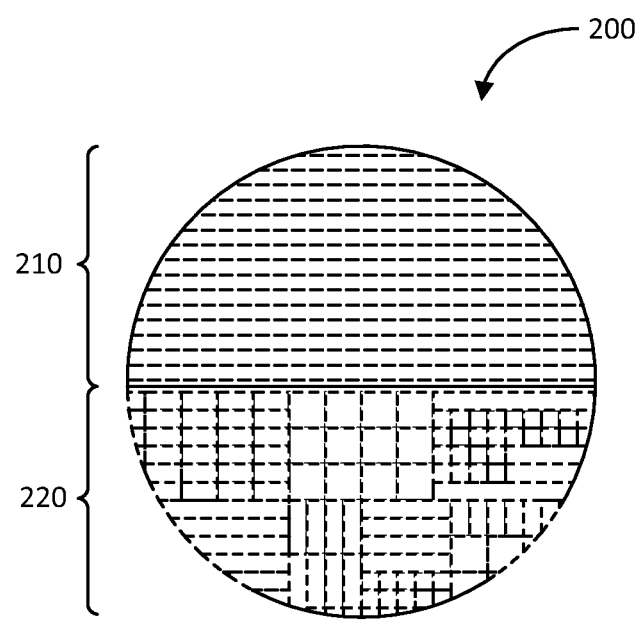
FIG. 2B illustrates a top layout blow-up view of a portion of the exemplary SOC IC of FIG. 2A in accordance with another aspect of the disclosure.

FIG. 2B illustrates a top layout blow-up view of a portion of the exemplary SOC IC 200 in accordance with another aspect of the disclosure. Again, the portion of the SOC IC 200 depicted is the boundary between the digital core 210 and the I/O AMS portion 220. As illustrated, the AMS circuit cells described herein are configured so that the I/O AMS portion 220 are arranged in a two-dimensional array configuration (e.g., rows and columns). In this way, the I/O AMS portion 220 looks more similar to the two-dimensional array of the circuit cells of the digital core 210. This leads to higher manufacturing yields for the SOC IC 200. As discussed below in more detail, each of the cells of the I/O AMS portion 220 has a size (e.g., height and width) based on a least common denominator (e.g., fin-pitch and poly-pitch) allowing cells to more easily be arranged in rows and columns.

Figure 3:
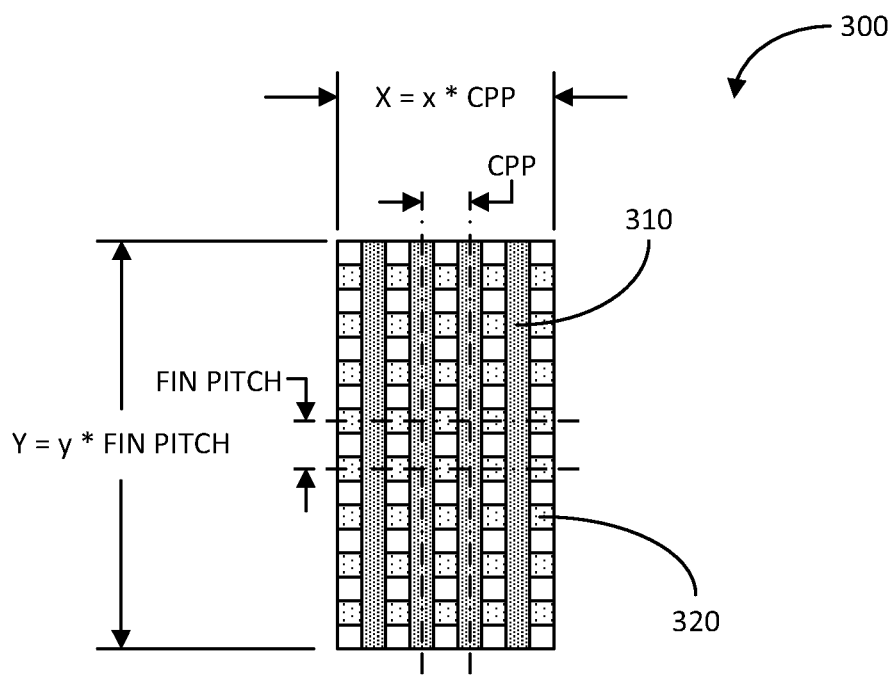
FIG. 3 illustrates a top view of an exemplary transistor-based circuit cell in accordance with another aspect of the disclosure.

FIG. 3 illustrates a top layout view of an exemplary transistor-based (leaf) cell 300 in accordance with another aspect of the disclosure. In this example, the transistor-based cell 300 is based on Fin field effect transistors (Fin FETs). The transistor-based cell 300 includes a set of polysilicon gates 310 longitudinally arranged vertically and staggered (equally-spaced) in a horizontal direction. The transistor-based cell 300 further includes a set of fins 320 longitudinally arranged horizontally and staggered (equally-spaced) in a vertical direction.

To facilitate the layout of the transistor-based cell 300 in a two-dimensional array (e.g., rows and columns), the height Y of the cell is an integer "y" multiplied by the fin pitch (FP). The fin pitch is defined as substantially the distance between the center of one fin 320 to the center of the adjacent fin along the vertical axis. Thus, the height of the transistor-based cell 300 may be represented as Y=y*fin pitch.

Also, to facilitate the layout of the transistor-based cell 300 in a two-dimensional array, the width X of the cell is an integer "x" multiplied by the contacted poly pitch (CPP). The poly pitch (CPP) is defined as substantially the distance between the center of one polysilicon gate 310 to the center of the adjacent polysilicon gate along the horizontal axis. Thus, the width of the transistor-based cell 300 may be represented as X=x*CPP.

The transistor-based cell 300 may be arrayed in the height Y-direction and in the width X-direction to build larger (and more complicated) cells or circuits. Such larger cells or circuits may have a height of a first integer $Int_1$ multiplied by the height Y of the transistor-based leaf cell 300, and a second integer $Int_2$ multiplied by the width X of the leaf cell, where integers $Int_1$ and $Int_2$ may be the same or different. As such, transistor-based cells may be arranged in rows and columns because they have the same or a multiple thereof of the height Y and width X of the transistor-based leaf cell 300.

In Fin FET technology, the analogous channel width of a device is related to the fin width multiplied by the number of fins. Note, the fin pitch is equal to the fin width plus the fin spacing. As an example, if the fin width is eight (8) nanometers (nm), and the cell 300 has a height of four (4) fins, then the devices of the cell has an analogous channel width of 32 nm. Although a leaf cell may be configured to have only a single fin, for improved manufacturing yield, it is desirable to have a minimum number of fins of more than one (1), such as four (4) fins, for example. If a wider channel device is desired, a cell may be configured to have a multiple integer ($Int_1$) of the number of fins in the basic leaf cell 300. For example, if 64 nm wide devices are desired, a transistor-based cell may be configured to have eight (8) fins with a fin width of 8 nm. Generally, the fin width depends on what the foundry (manufacturer) can achieve in their process.

Also, in Fin FET technology, the achievable channel length of the devices (if the devices are configured in a stack) is represented by the poly gate length multiplied by the number of polysilicon gates. Note, the poly pitch (CPP) is equal to the poly gate length plus the gate spacing. As an example, if the poly gate length is 40 nm, and the cell 300 has a width X of four (4) polysilicon gates, the achievable or maximum channel length of the cell is 160 nm. If a longer channel device is desired, a cell may be configured to have a multiple integer ($Int_2$) of the number of polysilicon gates in the basic leaf cell 300. For example, if a 320 nm length device is desired, a transistor-based cell may be configured to have eight (8) polysilicon gates with a poly gate length of 40 nm. Similarly, gate length and poly pitch (CPP) depend on what the foundry (manufacturer) can achieve in their process.

Figure 4:
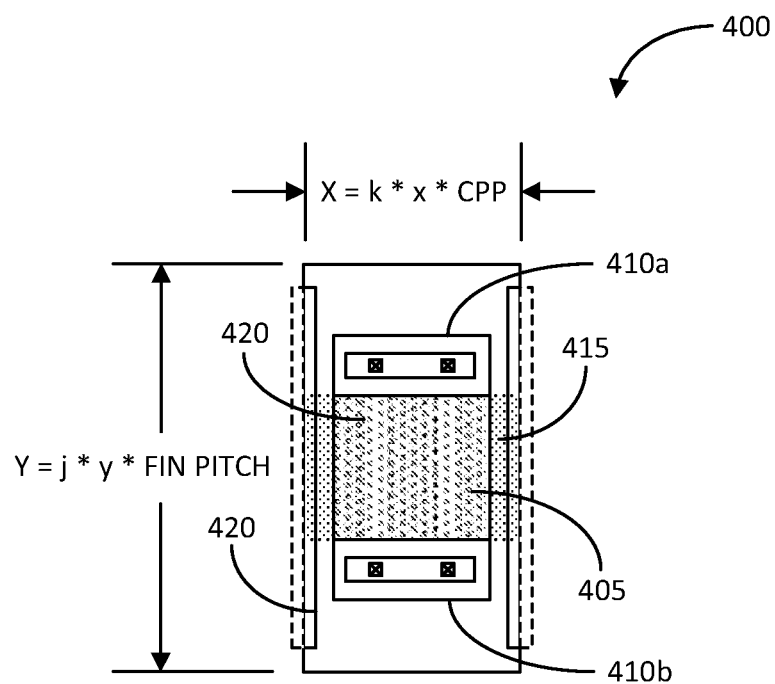
FIG. 4 illustrates a top view of an exemplary thin-film resistor cell in accordance with another aspect of the disclosure.

FIG. 4 illustrates a top view of an exemplary thin-film resistor-based cell 400 in accordance with another aspect of the disclosure. So that thin-film resistor cells may also be tiled with a two-dimensional array with transistor-based cells, the height Y and width X of the thin-film resistor cell 400 are also based on the fin pitch (FP) and CPP of the transistor-based leaf cell 300. For example, the height Y of the thin-film resistor cell 400 may be an integer "j" multiplied by the height of the transistor-based leaf cell 300, which is y*fin pitch, where j is an integer of one or more (e.g., Y=j*y*fin pitch). Similarly, the width X of the thin-film resistor cell 400 may be an integer k multiplied by the width of the transistor-based leaf cell 300, which is x*CPP, where k is an integer of one or more (e.g., X=k*x*CPP). It is noted that passive cells, such as thin-film resistors and capacitors cells as discussed below, (as well as active devices in some cases, depending on technology), usually include dummy polysilicon and diffusion shapes beneath these elements to meet density requirements.

In the past, thin-film resistor cells used in ICs have been typically sized to meet the desired resistance. However, due to the desire for a two-dimensional arrangement of AMS cells in accordance with this disclosure, the dimensions of thin-film resistor cells are based on integers k and j multiple of the leaf cell height and width, respectively. Accordingly, as the resistance of a thin-film resistor is based on its height and width, the resolution of the achievable resistance of the thin-film resistor cell is based on the height and width of the leaf cell 300. Thus, the resolution of the resistance of thin-film cells is somewhat compromised to achieve an improved two-dimensional arrangement of AMS cells, which typically results in a higher manufacturing yield.

With regard to exemplary details of the resistor cell 400, the cell includes a thin-film resistivity material 405 (e.g., titanium-nitride (TiN)) configured as a square or rectangle. The resistor cell 400 further includes first and second resistor contacts 410a and 410b, respectively. The thin-film resistivity material 405 overlies a dummy diffusion region 415 for density requirements. Similarly, for density requirement purposes, the resistor cell 400 includes a set of dummy polysilicon gates 420. Note that the left- and right-boundaries of the resistor cell 400 passes through the center line of the left-most and right-most dummy polysilicon gates 420. This facilitates abutting the resistor cell 400 in the horizontal direction with other similarly-configured resistor cells, where the abutting resistor cells provide the other halves of the dummy polysilicon gates.

Figure 5A:
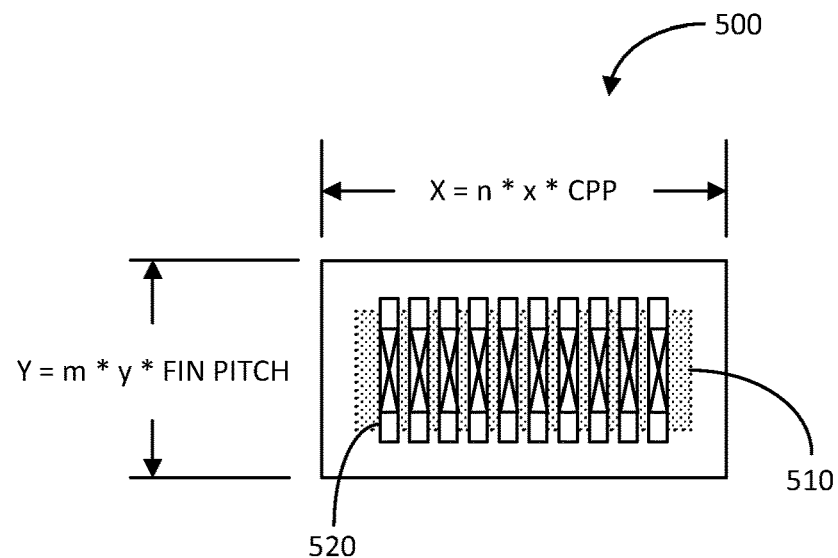
FIG. 5A-5C illustrates top views of exemplary capacitor cells in accordance with another aspect of the disclosure.

FIG. 5A illustrates a top view of an exemplary capacitor-based cell 500 in accordance with another aspect of the disclosure. Again, so that capacitor-based cells may also be tiled with a two-dimensional array with transistor-based cells (as well as resistor-based cells), the height Y and width X of the capacitor-based cell 500 are also based on the fin pitch (FP) and poly pitch (CPP) of the transistor-based leaf cell 300. For example, the height Y of the capacitor-based cell 500 may be an integer "m" multiplied by the height of the transistor-based leaf cell 300, which is y*fin pitch, where m is an integer of one or more (e.g., Y=m*y*fin pitch). Similarly, the width X of the capacitor-based cell 500 may be an integer "n" multiplied by the width of the transistor-based leaf cell 300, which is x*CPP, where n is an integer of one or more (e.g., X=n*x*CPP). The capacitor-based cell 500 may be configured as a device capacitor, metal-insulator-metal (MIM) capacitor, a metal-oxide-metal (MOM)

capacitor, stacked capacitor, or other type. It is noted that active elements may be situated beneath non-active-type capacitors.

With regard to this particular example, the capacitor-based cell 500 is configured as a device capacitor including a grounded N-type diffusion region 510 and a set of metallization strips 520 (e.g., at the lowest metallization layer (M1)). The set of metallization strips 520 serve as the non-grounded terminal of the capacitor-based cell 500 and the grounded N-type diffusion region 510 serves as the grounded terminal of the capacitor-based cell. Thus, the capacitor-based cell 500 may be used for shunt capacitor applications.

Figure 5B:
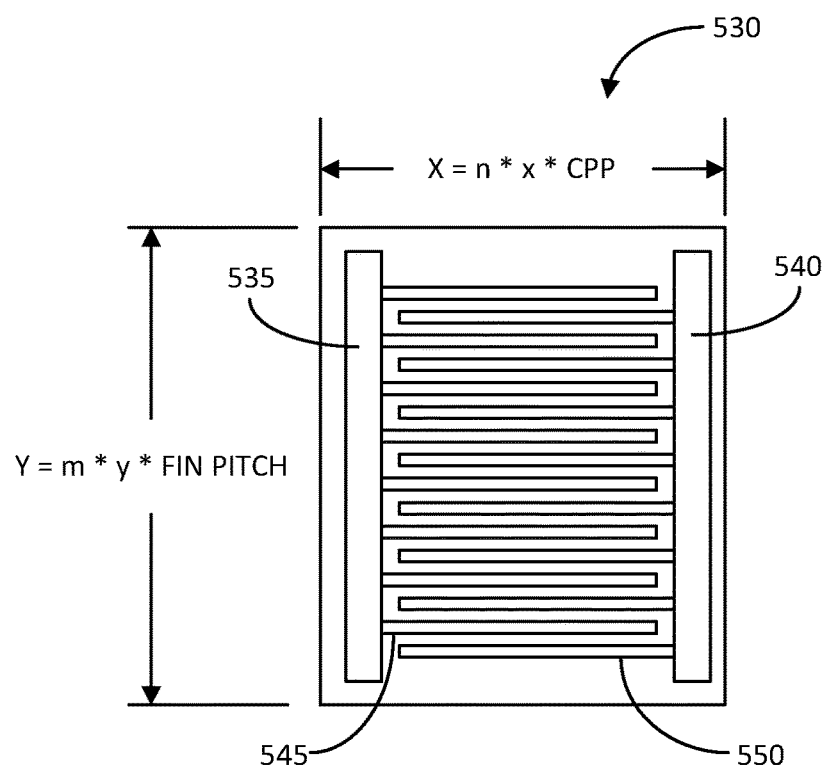

FIG. 5B illustrates a top view of another exemplary capacitor-based cell 530 in accordance with another aspect of the disclosure. Again, so that capacitor-based cells may also be tiled with a two-dimensional array with transistor-based cells (as well as resistor-based cells), the height Y and width X of the capacitor-based cell 530 are also based on the fin pitch (FP) and poly pitch (CPP) of the transistor-based leaf cell 300. For example, the height Y of the capacitor-based cell 530 may be an integer "m" multiplied by the height of the transistor-based leaf cell 300, which is y*fin pitch, where m is an integer of one or more (e.g., Y=m*y*fin pitch). Similarly, the width X of the capacitor-based cell 530 may be an integer "n" multiplied by the width of the transistor-based leaf cell 300, which is x*CPP, where n is an integer of one or more (e.g., X=n*x*CPP).

In this example, the capacitor-based cell 530 is configured as a metal-oxide-metal (MOM) capacitor with a first terminal 535, a second terminal 540, a first set of fingers 545 electrically coupled to the first terminal 535 and extending in a direction towards the second terminal 540, and a second set of fingers 550 electrically coupled to the second terminal 540 and extending in a direction towards the first terminal 535. The first set of fingers 545 extend parallel and between the second set of fingers 550, respectively.

Figure 5C:
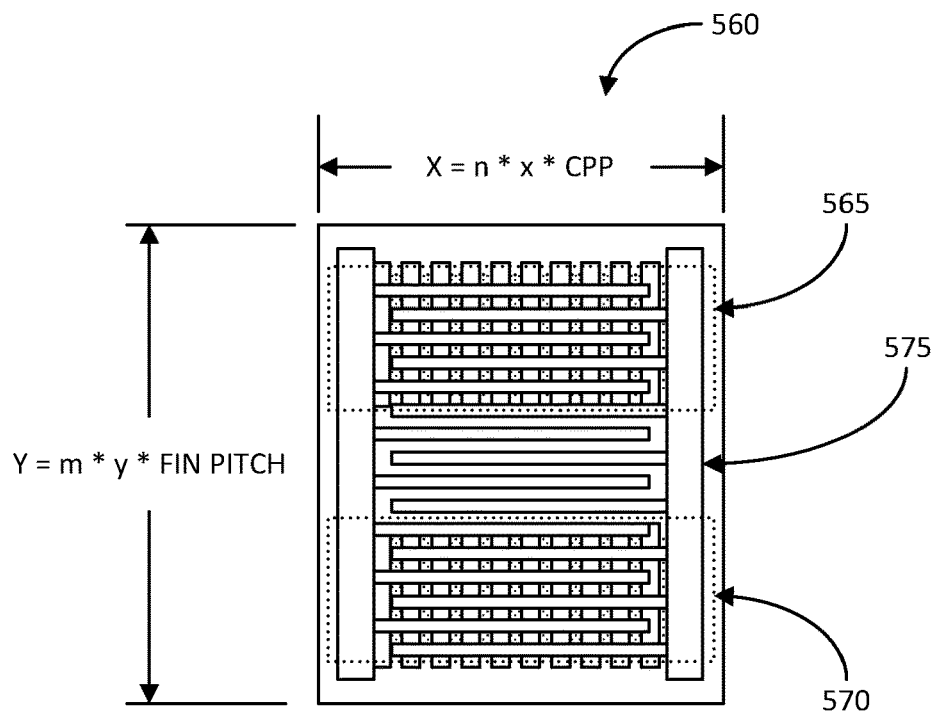

FIG. 5C illustrates a top view of another exemplary capacitor-based cell 560 in accordance with another aspect of the disclosure. Similarly, so that capacitor-based cells may also arranged in a two-dimensional array with transistor-based cells (as well as resistor-based cells), the height Y and width X of the capacitor-based cell 560 are also based on the fin pitch (FP) and poly pitch (CPP) of the transistor-based leaf cell 300. For example, the height Y of the capacitor-based cell 560 may be an integer "m" multiplied by the height of the transistor-based leaf cell 300, which is y*fin pitch, where m is an integer of one or more (e.g., Y=m*y*fin pitch). Similarly, the width X of the capacitor-based cell 560 may be an integer "n" multiplied by the width of the transistor-based leaf cell 300, which is x*CPP, where n is an integer of one or more (e.g., X=n*x*CPP).

In this example, the capacitor-based cell 560 is configured as a stacked capacitor, including a first device capacitor 565, a second device capacitor 570 juxtaposed with the first device capacitor 565, and a MOM capacitor 575 overlying the first and second device capacitors 565 and 570. Each of the first and second device capacitors 565 and 570 may be configured similar to the device capacitor of capacitor-based call 500. Similarly, the MOM capacitor 575 may be configured similar to the MOM capacitor of capacitor-based cell 530.

Figure 6:
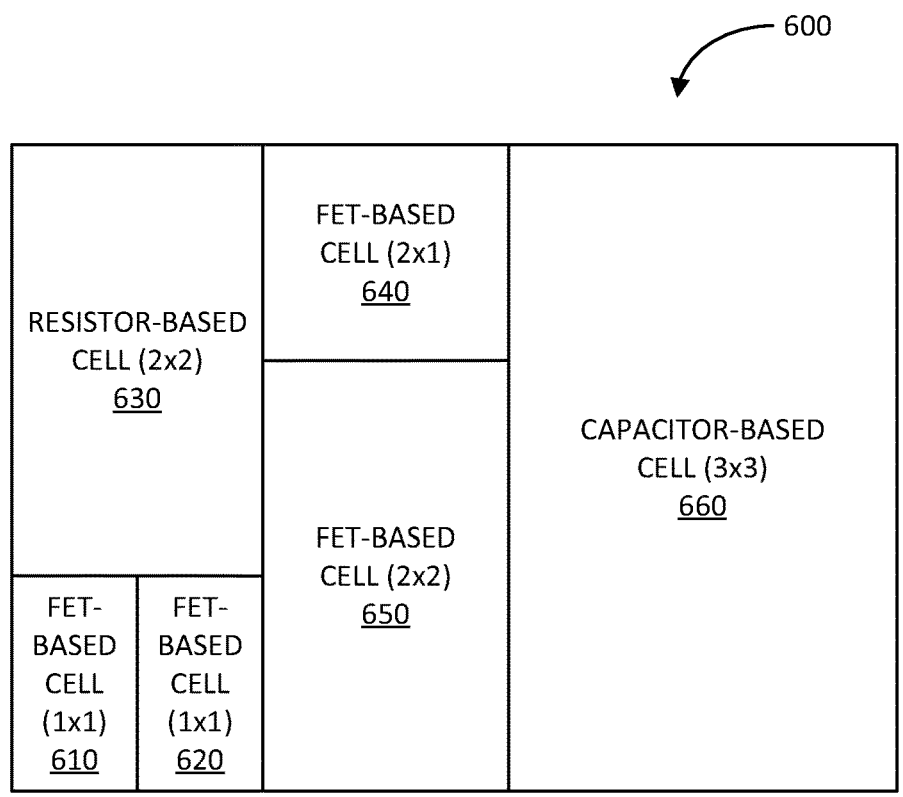
FIG. 6 illustrates a top view of an exemplary IC layout including a set of transistor-based cells, a resistor-based cell, and a capacitor-based cell in accordance with another aspect of the disclosure.

FIG. 6 illustrates a top view of an exemplary IC layout 600 in accordance with another aspect of the disclosure. The IC layout 600 demonstrates that by using least common denominators (e.g., based on poly pitch and fin pitch) based on the width X and height Y of the basic leaf-cell 300, the IC layout 600 may be neatly arranged in a two-dimensional array, which, as discussed, typically results in higher manufacturing yield and easier integration with other circuitry.

In particular, the IC layout 600 includes transistor-based cells 610, 620, 640, and 650, resistor-based cell 630, and a capacitor-based cell 660. The transistor-based cells 610 and 620 each have the width and height of the basic leaf cell 300; indicated as 1×1, where the left 1=X, the width of the basic leaf cell and the right 1=Y, the height of the basic leaf cell. The transistor-based cells 640 and 650 have dimensions of 2×1 and 2×2, respectively. The resistor-based cell 630 has a dimension of 2×2, and the capacitor-based cell 660 has a dimension of 3×3.

With the aforementioned dimensions of the cells based on least common denominators X and Y, the cells of the IC layout 600 may be arranged in a two-dimensional array for improved manufacturing yield. For example, the cumulative width of the transistor-based cells 610 and 620 being 2× matches the 2×width of the resistor-based cell 630. Thus, the resistor-based cell 630 may be placed directly above the transistor-based cells 610 and 620 to form a column of cells. The transistor-based cells 640 and 650 each have a width of 2×; and similarly, the transistor-based cell 640 may be placed directly above the transistor-based cell 650 to form another column of cells.

The cumulative height 3Y of the resistor-based cell 630 stacked on top of the transistor-based cells 610 and 620 matches the cumulative 3Y of the transistor-based cell 640 stacked on top of the transistor-based cell 650, which, in turn, matches the height of 3Y of the capacitor-based cell 660. Thus, the IC layout 600 may be configured into rows, where some cells occupy one row, other cells occupy two rows, and other cell occupy three rows. Accordingly, the IC layout 600 has a rectangular or two-dimensional array of cells, which, generally results in a higher manufacturing yield. Although, in practice, as explained in more detail herein, some cells may not directly abut other cells because a transition or termination may be needed to separate various cells for electrical isolation and performance yield purposes.

Circuit integration, such as the example depicted in layout 600, are generally difficult because of the non-uniform nature of analog layouts (e.g., non-uniform left and right edges). There is usually some sort of requirement for active layer spacing (diffusion) that is often difficult to achieve with irregular layout. The FEOL (front end of line) fill routines provided by foundries will usually be able to place dummy poly shapes, but dummy diffusion shapes typically require a larger area. If the edges of two macros are parallel, they can either be placed close enough that no diffusion fill is needed, or will have a large enough area between them so that the fill routine will generate the dummy diffusion shapes.

The transistor-based cell may be configured for complementary metal oxide semiconductor (CMOS) technology. The CMOS technology includes both p-channel metal oxide semiconductor (PMOS) FETs or devices and n-channel metal oxide semiconductor (NMOS) FETs configured to work together on the same IC. The CMOS cells used in the I/O AMS portion of the IC will be configured for design for manufacturing (DFM), design for yield (DFY), best known method (BKM), performance, and electromigration considerations. Many of these characteristics also apply to analog circuitry as well as CMOS digital circuitry.

Some of the characteristics of analog CMOS cells include configuring the height of the CMOS analog cell based on fin pitch and width based on poly pitch (CPP), as discussed with reference to the transistor-based cell 300. Analog CMOS cells may be designed using non-minimum metal widths, redundant vias, non-minimum vias, such as rectangular vias or larger square vias, redundant power rails, built-in substrate ties and well ties. Additionally, as discussed in more detail herein, endcaps and dummy cells may be used at opposite ends of rows of analog CMOS cells for electrical isolation as well as maintaining a more uniform threshold voltages for the functional devices within the rows of cells.

Also, as discussed further herein, the analog CMOS cells may be reconfigured merely by performing metal layer changes; the polysilicon and diffusion region are consistent across the cells in the cell design library. As an example, a string of 8-10 inverters in a row or 8-10 dummy cells in a row may be reconfigured as a flip-flop merely by metal layer changes. Analog CMOS cells may include metal layers that may be configured for power rail or routing track applications. For example, if improved power performance is desirable, use the cell metal layer for power rail use. If improved routing is desirable, use the cell metal layer to facilitate circuit routing.

Another characteristic of the analog CMOS cells is that the metals are built up to a "normal" metal layer; that is, a metal layer that does not require special properties, such as multi-patterning technology, require cut layers, and use extreme ultraviolet lithography (EUV). Thus, the difficulties in dealing with lower metal layers are taking care of, and a designer can use these cells out-of-the-box and need not understand the complications that are involved underneath. This also applies to non-CMOS cells. With regard to via redundancies, the idea is getting good current flow (i.e., reduced resistance) in the current paths into and out of the devices. This may be accomplished by having more (and/or larger) vias, as well as more metals in parallel, so that current travel along the relatively high-resistance lower metal layers is reduced. However, if more routing flexibility is desired, the number of metal layers in the CMOS (or non-CMOS analog) leaf cells may be reduced.

Figure 7:
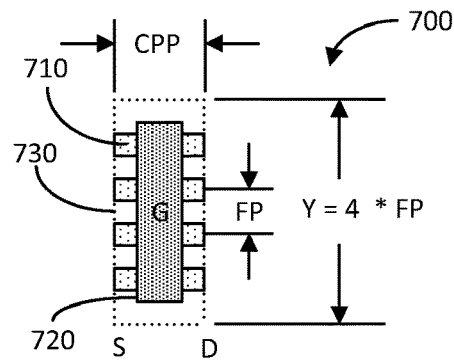
FIG. 7 illustrates a top view of an exemplary single-transistor cell in accordance with another aspect of the disclosure.

FIG. 7 illustrates a top view of an exemplary single-transistor cell 700 in accordance with another aspect of the disclosure. A construction of an analog leaf cell may begin with a process design kit (PDK) device, and put it in a cell. Accordingly, the single-transistor cell 700 includes a Fin FET with a set of fins 710 (e.g., four (4)) and a polysilicon gate 720. The fins 710 longitudinally extend along a first direction (e.g., horizontal) and are spaced part in a second direction (e.g., vertical or orthogonal to the first direction) by the fin pitch (FP). The polysilicon gates 720 longitudinally extend along the second direction and are spaced part in the first direction by the poly pitch (CPP). The portion of the fins 710 to the left of the gate polysilicon 720 may be configured as the source (S) of the Fin FET, the portion of the fins 710 on the right of the gate polysilicon 720 may be configured as the drain (D) of the Fin FET, and the polysilicon 720 serves as the gate (G).

The single-transistor cell 700 includes a bounding box 730 to help connecting a set of single-transistor cells together to construct larger cells and keep the height and width of the constructed cell all on pitch (e.g., the height being a multiple integer of the fin pitch (FP) and the width being a multiple integer of the poly pitch (CPP)). To achieve this pitch, the width of the bounding box 730 is the poly pitch (CPP) and the height Y of the bounding box is four (4) multiplied by the fin pitch (FP), as the single-transistor cell 700, in this example, has four (4) fins.

The height Y of the single-transistor cell 700 is merely the height of the transistor portion of the cell. As discussed below with reference to analog leaf cell 1000, it shall be understood that the height of the entire cell may be larger to accommodate gate contacts, gate-to-gate spacing (in the height- or y-direction, horizontal metal routing, and/or for proper feature density); but the height of the cell will remain an integer multiple of the fin pitch. For example, the gate connection to the single-transistor cell 700 may be situated above or below the basic transistor cell 700.

Figure 8:
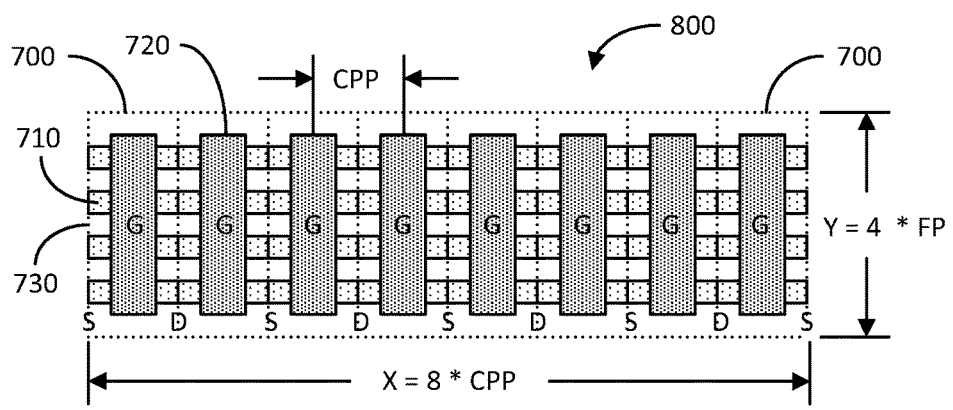
FIG. 8 illustrates a top view of an exemplary transistor-based cell in accordance with another aspect of the disclosure.

FIG. 8 illustrates a top view of an exemplary transistor-based cell 800 in accordance with another aspect of the disclosure. The transistor-based cell 800 includes a set of the single-cell devices 700 chained together to form a row (e.g., along the longitudinal direction of the fins 710). In this example, the set includes eight (8) Fin FETs, but may include a different number of devices. As illustrated, the side edges of the bounding boxes 730 of adjacent single-transistor cells 700 abut or register to cause all the fins of the devices to horizontally align. This also results in the top and bottom edges of the bounding boxes 730 and the set of single-transistor cells 700 to also horizontally align, respectively.

As discussed above, the bounding boxes 730 of the transistor-based cell 800 facilitates the cell to be on pitch. In this regard, the center-line-to-center line distance of adjacent polysilicon gates 720 along the horizontal direction is the desired poly pitch (CPP) (e.g., the width of the bounding box 730). Since there are eight (8) single-transistor cells 700 in the transistor-based cell 800, the width X of the cell is eight (8) multiplied by the poly pitch (CPP); thereby, keeping the cell 800 on pitch with respect to the poly pitch (CPP). As the bounding box 730 registers the single-transistor cells 700 in a horizontally aligned manner, the height Y of the cell is four (4) multiplied by the fin pitch (FP); thereby, keeping the cell 800 on pitch with respect to the fin pitch (FP).

Similarly, the height Y of the transistor-based cell 800 is merely the height of the transistor portion of the cell. As discussed below with reference to analog leaf cell 1000, it shall be understood that the height of the entire cell may be larger to accommodate gate contacts, gate-to-gate spacing (in the height- or y-direction, horizontal metal routing, and/or for proper feature density); but the height of the cell will remain an integer multiple of the fin pitch. For example, the gate connection to the transistor-based cell 800 may be situated above or below the basic transistor cell 800.

In this example, the transistor-based cell 800 includes an even number (e.g., eight (8)) of single-transistor cells 700. In this configuration, the transistor-based cell 800 includes a source (S) terminals of different devices at opposite ends. This facilitates connecting (abutting) two or more transistor-based cells together to form a row of cells where the sources of adjacent cells are coupled in parallel.

Although not shown in FIG. 8, but discussed further herein, the transistor-based cell 800 includes overlay metals, vias, and contacts to configure the cell into various analog circuit elements. For example, with such overlay metals, vias, and contacts, the transistor-based cell 800 may be configured as a differential pair, a current mirror, a stack-2 or stack-4 bias circuit, a dummy cell, a stack bias circuit with an enable, a stack bias circuit with a cascode device, a foot switch, a head switch, and others. As previously mentioned, the transistor-based cell 800 may be designed up to a "normal" metal layer, where a layout designer need only be concerned about routing and interconnect.

Figure 9:
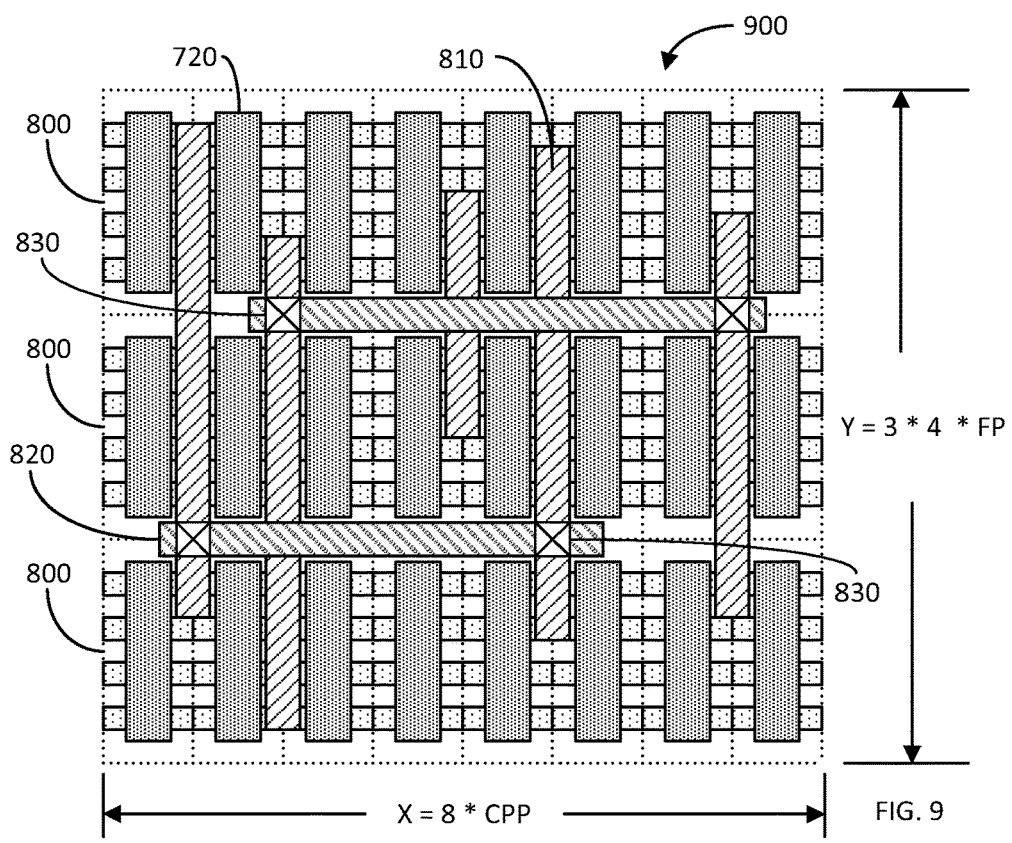
FIG. 9 illustrates a top view of an exemplary circuit with an arranged set of multiple transistor-based cells in accordance with another aspect of the disclosure.

FIG. 9 illustrates a top view of an exemplary circuit 900 in accordance with another aspect of the disclosure. The circuit 900 includes a set of the transistor-based cells 800 arrayed in the vertical direction (e.g., along the longitudinal direction of the polysilicon gates 720). In this example, the set includes three (3) transistor-based cells 800, but may include a different number of cells. As illustrated, the top/bottom edges of the bounding boxes 730 associated with the transistor-based cells 800 abut or register with each to cause all the polysilicon gates to vertically align. This also results in the side edges of the bounding boxes 730 and the set of transistor-based cells 800 to vertically align, respectively.

As discussed above, the bounding boxes 730 of the transistor-based cells 800 facilitate the circuit 900 to be on pitch. In this regard, the width X of the circuit 900 is eight (8) multiplied by the poly pitch (CPP); thereby, keeping the circuit 900 on pitch with respect to the poly pitch (CPP). As the bounding box 730 registers the transistor-based cells 800 in a vertically aligned manner, the height Y of the circuit 900 is three (3) (number of transistor-based cells 800) multiplied by four (4) (number of fins per transistor-based cell 800) multiplied by the fin pitch (FP); thereby, keeping the circuit 900 on pitch with respect to the fin pitch (FP).

The circuit 900 further includes top-level metal interconnects for electrically connecting the transistor-based cells 800 to each other. In this example, the circuit 900 includes a top-level metal interconnect 810 for vertically connecting the transistor-based cells 800 to each other and/or to other cells not shown herein. Similarly, the circuit 900 includes another top metal interconnect 820 for horizontally connecting the transistor-based cells 800 to other cells not shown herein. Additionally, the circuit 900 includes connections and vias 830. By connecting transistor-based cells 800 in this manner, the circuit 900 may be configured into many analog circuits, such as bias blocks, operational amplifiers, and/or others. The device length/width, cell length/width, and circuit length/width are selected to meet density and spacing requirements and performance.

Similarly, the height Y of the circuit 900 is merely the height of the transistor portion of the cell. As discussed below with reference to analog leaf cell 1000, it shall be understood that the height of the circuit may be larger to accommodate gate contacts, gate-to-gate spacing (in the height- or y-direction, horizontal metal routing, and/or for proper feature density); but the height of the cell will remain an integer multiple of the fin pitch. For example, the gate connection to the transistor-based cells 800 may be situated above, below, and/or between the transistor-based cells 800.

FIGS. 10A-10F illustrate top views of various layers of an exemplary transistor-based analog leaf cell 1000 in accordance with another aspect of the disclosure. In summary, the transistor-based cell 1000 may be configured for any height being a multiple of the fin pitch (FP). For example, for relatively lower or "normal" voltage applications, the height of the transistor-based cell 1000 may be set to 16 fins. For relatively higher voltage applications, the height of the transistor-based cell 1000 may be set to 24 fins to allow for wider metal spacing. Other height configurations are possible. The transistor-based cell 1000 may be configured for any width being a multiple of the polysilicon gate length. For example, the transistor-based cell 1000 may be configured to have a channel length of 30 nm, 40 nm, 82 nm, 150 nm, 190 nm, or other.

Each of these gate lengths will have a corresponding CPP. Also, some gate lengths will work well together, and some will not, based on the greatest common denominator. For example, if the minimum CPP=54 nm (for minimum gate lengths), it would be ideal if the other gate lengths had CPP values that would be multiples of this or would allow the easy creation of integer ratios of devices. An 82 nm device will have a CPP of 162 nm. One CPP=162 nm device will fit into the same width as three CPP=54 nm devices, three CPP=162 nm devices will fit into the same area as ten CPP=54 nm devices, etc. The idea is that if each row of devices in a circuit can ultimately have the same width by using gate lengths with compatible CPPs (e.g., Cell Width=N1*CPP1=N2*CPP2=N3*CPP3 . . . ), then there may be fewer integration issues.

The transistor-based cell 1000 may be configured to have different channel width devices. For example, the transistor-based cell 1000 may include devices with a channel width of four (4) fins, eight (8) fins, or other. The transistor-based cell 1000 may be configured to have a continuous diffusion region. The advantage of continuous diffusion is that a break in the diffusion requires both sides of the diffusion break to have correct terminations, which takes up considerable area (especially if there is a concern about device thresholds, which would require the addition of dummy devices). Additionally, the transistor-based cell 1000 may include groups of four (4) devices, eight (8) devices, or more (or less as well). As previously discussed, the transistor-based cell 1000 may be built up to the first "normal" metal, which has been previously defined. The transistor-based cell 1000 includes "tracks" or metal interconnects to support array connections in both horizontal and vertical directions, as well as make connections internal to the cell.

The transistor-based cell 1000 may include multiple (e.g., two (2)) gate connections for either redundant gate connections or separate (independent) gate connections. The transistor-based cell 1000 may be configured to have source on the left- and right-ends. This facilitates a source net common across a row of cells (e.g., sources connect when cells are connected by abutment). If independent sources are required for cells in a common row, a "break" cell (referred hereinafter as a break cell) may be used between them to isolate the sources or to add enough space to create a diffusion break (including terminations, etc.). A break cell is discussed in more detail herein. On the other hand, the transistor-based cell 1000 may be configured such that the gates and drains do not connect by abutment along a row. However, it shall be understood that the transistor-based cell may be configured to connect the gates and/or drains of adjacent cells by abutment.

Returning briefly to break cells, the idea of the break cell is to break connections, specifically, source connections in a row of cells, but to maintain the continuous diffusion. There is also another cell (referred to as a "midcap" cell) that can be used to break both the connections and the diffusion (it is essentially a back-to-back endcap cell constructed to have proper diffusion termination in both directions). This cell is typically used so that the maximum length of continuous diffusion will not be exceeded. This is especially important for bias circuits or DACs where very large arrays of these leaf cells may be used. Note that breaking the diffusion is typically going to take up more space (with the required termination and recommended dummies) than using the break cell. This is why the midcap cell is typically only used when a diffusion break is absolutely necessary, rather than to simply break connections.

The transistor-based cell 1000 typically are configured without using dummy devices, but may include some to achieve certain characteristics, such as in the case of a foot switch or head switch described herein. The transistor-based cell 1000 may be configured as a dummy cell for use in separating the operational circuit cells from ends of a row for performance uniformity purpose, as further described herein. The minimum cell size (e.g., number of devices) is selected to allow for minimum metal area/spacing (horizontal)/tracks (vertical). The aforementioned characteristics is described below with reference to the different layers of the transistor-based cell 1000 illustrated in FIGS. 10A-10F.

Figure 10A:
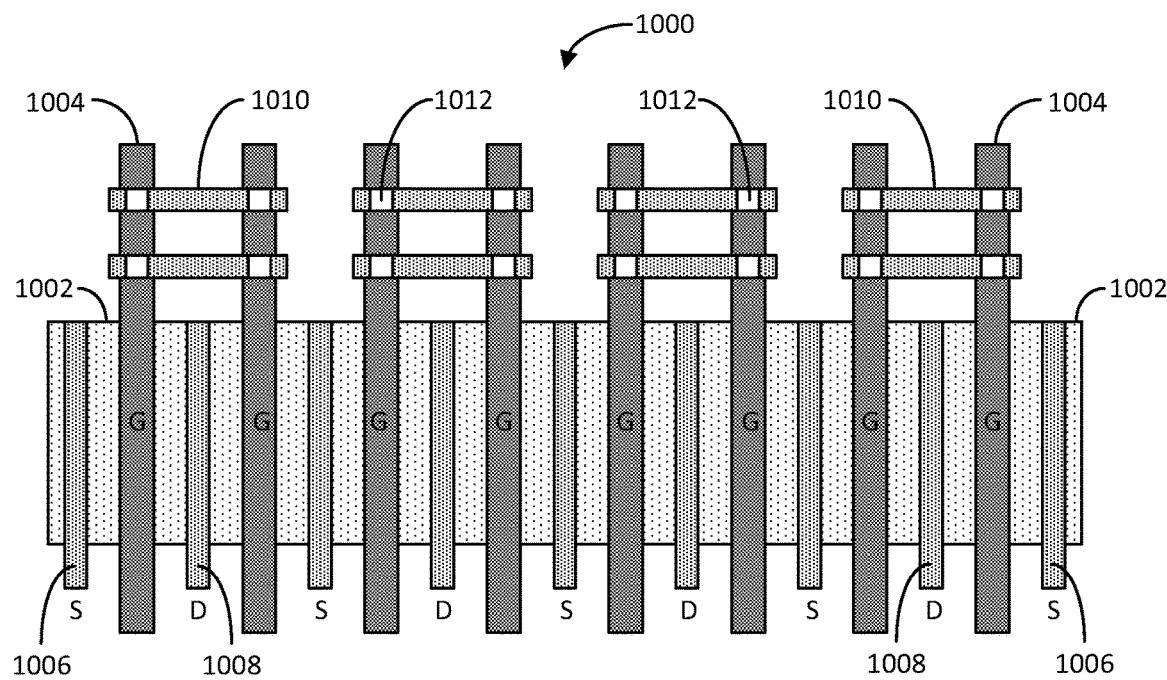
FIGS. 10A-10F illustrate top views of exemplary layers of a transistor-based cell in accordance with another aspect of the disclosure.

FIG. 10A illustrates a top layout view of the exemplary transistor-based cell 1000 including the lower layer features, such as the polysilicon gates, diffusion region, and source/drain contacts. In particular, the transistor-based cell 1000 includes a continuous diffusion region 1002 extending horizontally or along the longitudinal direction of the fins. The transistor-based cell 1000 further includes a set of polysilicon gates 1004 disposed over the diffusion region 1002, vertically extending from above to below the diffusion region, and equally spaced with a distance of the poly pitch (CPP) along the horizontal direction. The transistor-based cell 1000 also includes redundant gate connections 1010 and associated contacts 1012 electrically connecting distinct adjacent pairs of the polysilicon gates.

Additionally, the transistor-based cell 1000 further includes a set of source (S) contact regions 1006 extending vertically over and across the diffusion region 1002, and situated between every other pair of polysilicon gates 1004 and at opposite ends of the cell. The transistor-based cell 1000 further includes a set of drain (D) contact regions 1008 extending vertically over and across the diffusion region 1002, and situated between every other pair of polysilicon gates 1004 different from the pairs of polysilicon gates between which the source contact regions 1006 are located.

Figure 10B:
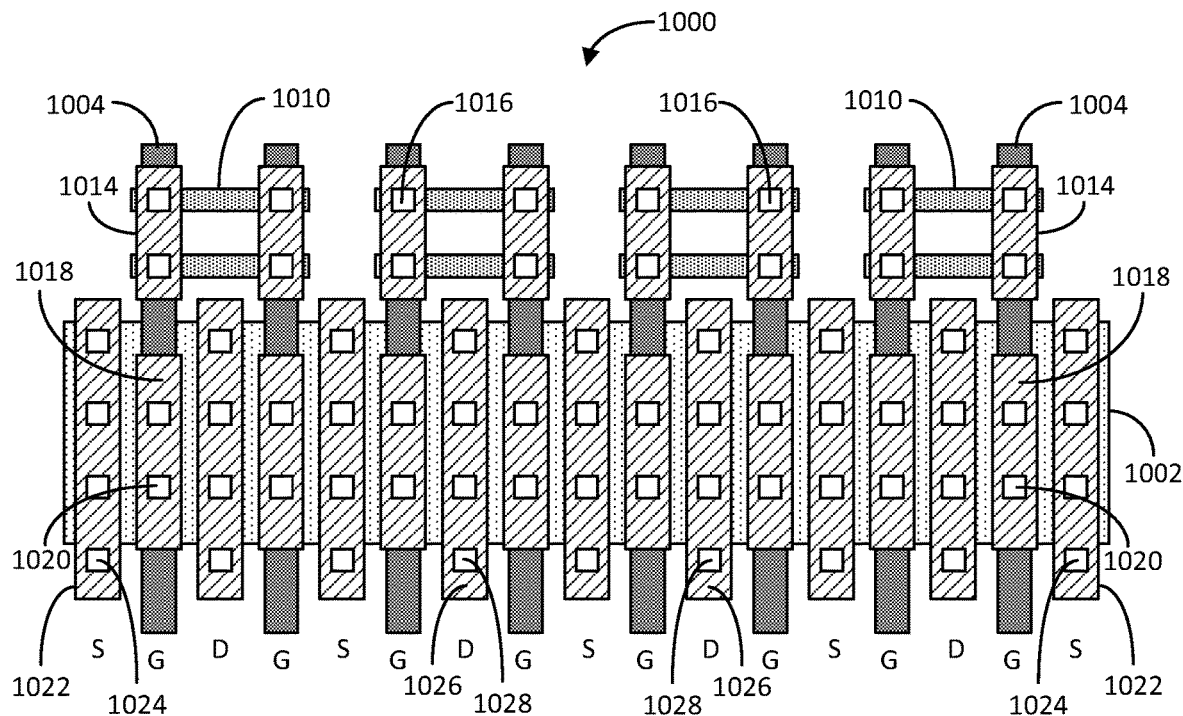

FIG. 10B illustrates a top layout view of the exemplary transistor-based cell 1000 including the first metal layer (M1) above the diffusion region 1002, polysilicon gates 1004 and source/drain contact regions 1006/1008. In particular, the transistor-based cell 1000 includes a set of M1 gate metal interconnects 1014 situated parallel and directly over a portion of the set of polysilicon gates 1004 not over the diffusion region 1002, and making electrical contact with the set of polysilicon gates via a set of vias 1016, respectively. The transistor-based cell 1000 further includes another set of M1 gate metal interconnects 1018 situated parallel and directly over another portion of the set of polysilicon gates 1004 over the diffusion region 1002, and making electrical contact with the set of polysilicon gates via another set of vias 1020, respectively.

The transistor-based cell 1000 also includes a set of M1 source metal interconnects 1022 situated parallel and directly over the set of source contact regions 1006 over the diffusion region 1002, and making electrical contact with the set of source contact regions 1006 via a set of vias 1024, respectively. Similarly, the transistor-based cell 1000 also includes a set of M1 drain metal interconnects 1026 situated parallel and directly over the set of drain contact regions 1008 over the diffusion region 1002, and making electrical contact with the set of drain contact regions 1008 via a set of vias 1028, respectively. The location and shapes of the aforementioned M1 metal interconnects may be configured for pattern consistency and density (or removed if not needed to make a connection or meet density requirements).

Figure 10C:
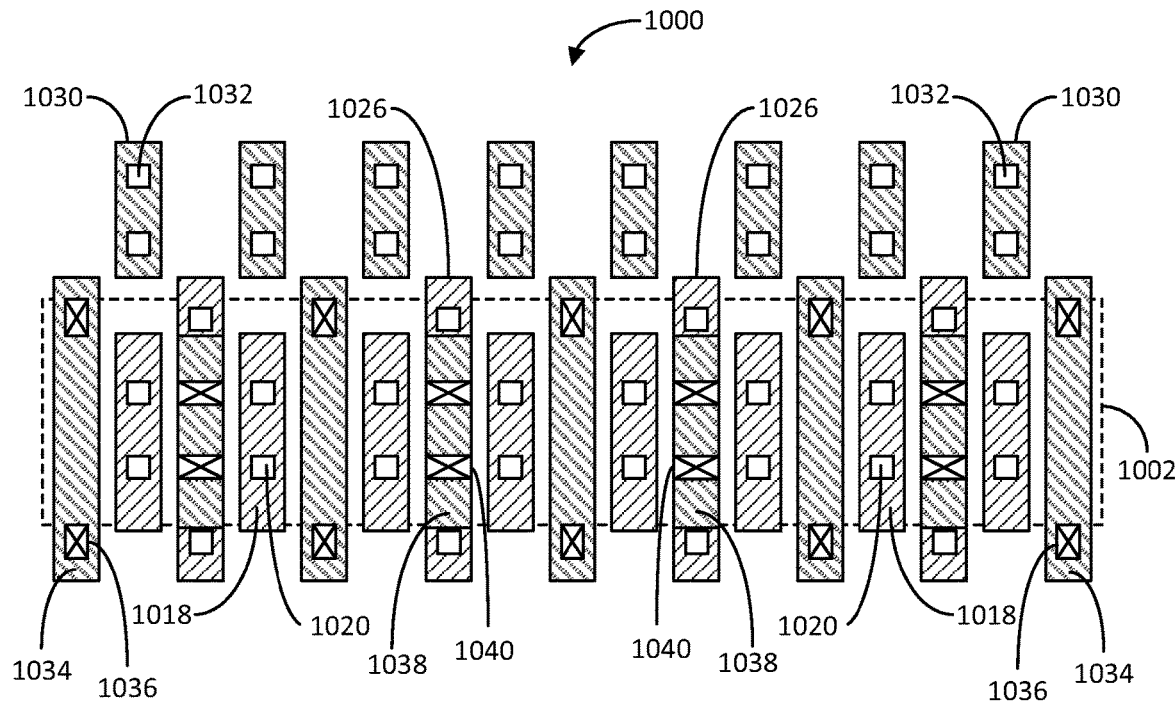

FIG. 10C illustrates a top layout view of the exemplary transistor-based cell 1000 including the second metal layer (M2) above the first metal layer M1 and the other aforementioned features. In particular, the transistor-based cell 1000 includes a set of M2 gate metal interconnects 1030 situated directly over and parallel with the set of M1 gate metal interconnects 1014, and making electrical contact thereto via a set of vias 1032, respectively.

The transistor-based cell 1000 also includes a set of M2 source metal interconnects 1036 situated directly over and parallel with the set of M1 source metal interconnects 1022, and making electrical contact thereto via a set of vias 1036, respectively. As illustrated, the vias 1036 may be configured as non-minimum vias, such as being rectangular in shape. Similarly, the transistor-based cell 1000 also includes a set of M2 drain metal interconnects 1038 situated directly over and parallel with a central portion of the set of M1 drain metal interconnects 1026, and making electrical contact thereto by way of a set of vias 1040, respectively. Similarly, the vias 1040 may be configured as non-minimum vias, such as being rectangular in shape.

Figure 10D:
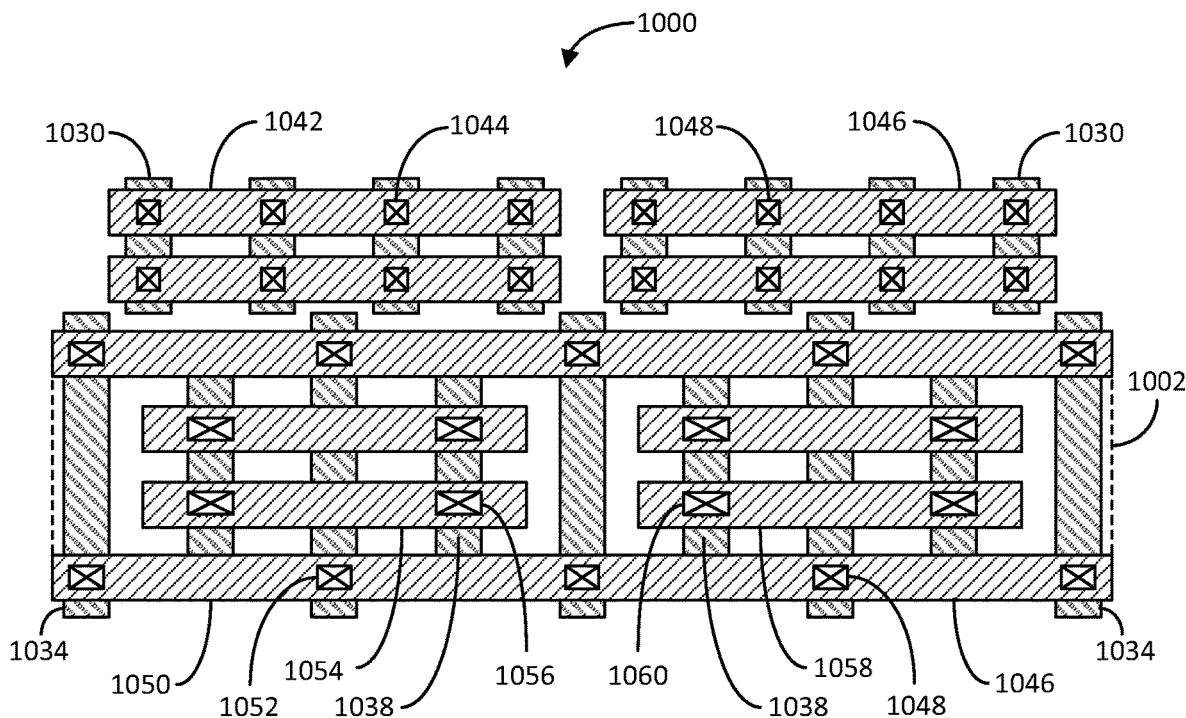

FIG. 10D illustrates a top layout view of the exemplary transistor-based cell 1000 including a third metal layer (M3) above the second metal layer M2 and the other aforementioned layers and features. The transistor-based cell 1000 includes a first pair of M3 horizontal metal interconnects 1042 electrically coupled to the left-side M2 gate metal interconnects 1030 via a set of vias 1044. The transistor-based cell 1000 includes a second pair of M3 horizontal metal interconnects 1046 electrically coupled to the right-side M2 metal gate interconnects 1030 via a set of vias 1048. In this configuration, the transistor-based cell 1000 has two (2) independent gate connections.

The idea is that by having the capability for two independent gate connections within a cell (so that, for example, in a cell with eight devices, 1, 2, 3, or 4 devices can be controlled independently of the other 7, 6, 5, or 4 devices, respectively), a circuit can be constructed with fewer cell instances. So, for example, in a digital-to-analog converter (DAC), a cell may be used that includes mostly "stack" devices to mirror the bias current, but also including a device (with separate gate connection from the gate of the stack) that can be used as a switch, to enable that portion of the DAC, so that a separate switch is not required. However, it shall be understood that a single-pair of horizontal metal interconnects may electrically connect to all gates to configure the transistor-based cell 1000 to have a single-gate connection.

The transistor-based cell 1000 includes a pair of M3 source horizontal metal interconnects 1050 electrically coupled to some or all of the M2 source metal interconnects 1034 via a set of vias 1052. As illustrated, the vias 1052 may be configured as non-minimum vias, such as being rectangular in shape. As the pair of M3 source horizontal metal interconnects 1050 extend the entire width of the transistor-based cell 1000 and are electrically connected to the source at the opposite ends of the cell, the transistor-based cells 1000 may be chained together in a row, and achieve a common source connection for such transistor-based cells. In the case of the transistor-based cell is configured as a transistor stack, one or more of the sources of intermediate transistors may not be electrically connected to the M3 source horizontal metal interconnect 1050.

The transistor-based cell 1000 includes a first pair of M3 drain horizontal metal interconnects 1054 electrically coupled to the left-side M2 drain metal interconnects 1038 via a set of vias 1056. As illustrated, the vias 1056 may be configured as non-minimum vias, such as being rectangular in shape. The transistor-based cell 1000 includes a second pair of M3 drain horizontal metal interconnects 1058 electrically coupled to the right-side M2 drain metal interconnects 1038 via a set of vias 1060. As illustrated, the vias 1060 may be configured as non-minimum vias, such as being rectangular in shape. In this configuration, the transistor-based cell 1000 has two (2) independent drain connections.

Figure 10E:
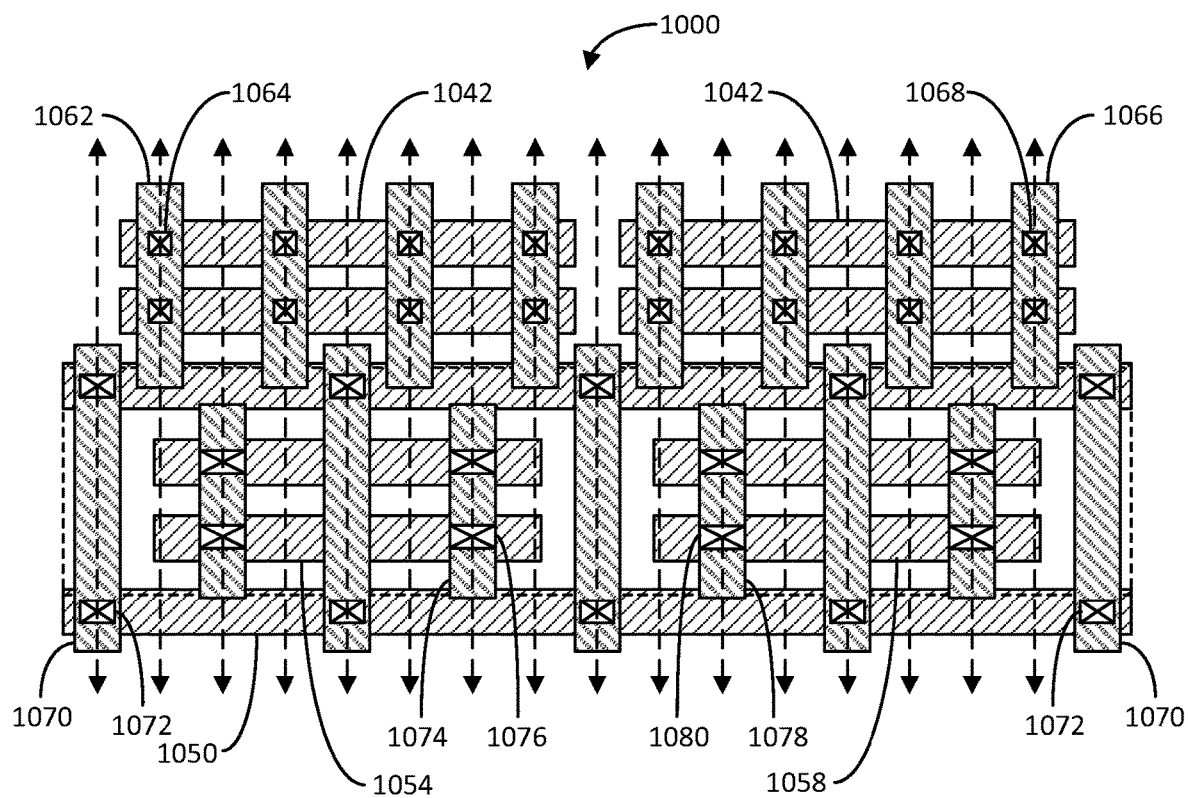

FIG. 10E illustrates a top layout view of the exemplary transistor-based cell 1000 including a fourth metal layer (M4) above the third metal layer M3 and the other aforementioned layers and features. In particular, the transistor-based cell 1000 includes a first set of M4 vertical metal interconnects 1062 electrically coupled to the M3 gate horizontal interconnects 1042 via a set of vias 1064. The transistor-based cell 1000 includes a second set of M4 vertical metal interconnects 1066 electrically coupled to the M3 gate horizontal interconnects 1046 via a set of vias 1068. The first and second sets of M4 vertical metal interconnects 1062 and 1064 are configured to electrically connect the common gate or the two independent gates of the transistor-based cell to one or more other cells.

Similarly, the transistor-based cell 1000 includes a set of M4 vertical metal interconnects 1070 electrically coupled to the M3 source horizontal metal interconnects 1050 via a set of vias 1072. As illustrated, the vias 1072 may be configured as non-minimum vias, such as being rectangular in shape. The set of M4 vertical metal interconnects 1070 may be configured to electrically connect to one or more other cells.

The transistor-based cell 1000 includes a first set of M4 vertical metal interconnects 1074 electrically coupled to the M3 drain horizontal metal interconnects 1054 via a set of vias 1076. As illustrated, the vias 1076 may be configured as non-minimum vias, such as being rectangular in shape. The first set of M4 vertical metal interconnects 1074 are configured to connect the left-side drain to one or more other cells. The transistor-based cell 1000 includes a second set of M4 vertical metal interconnects 1078 electrically coupled to the M3 drain horizontal metal interconnects 1058 via a set of vias 1080. As illustrated, the vias 1080 may be configured as non-minimum vias, such as being rectangular in shape. The second set of M4 vertical metal interconnects 1078 may be configured to connect the right-side drain of the transistor-based cell 1000 to one or more other cells.

Figure 10F:
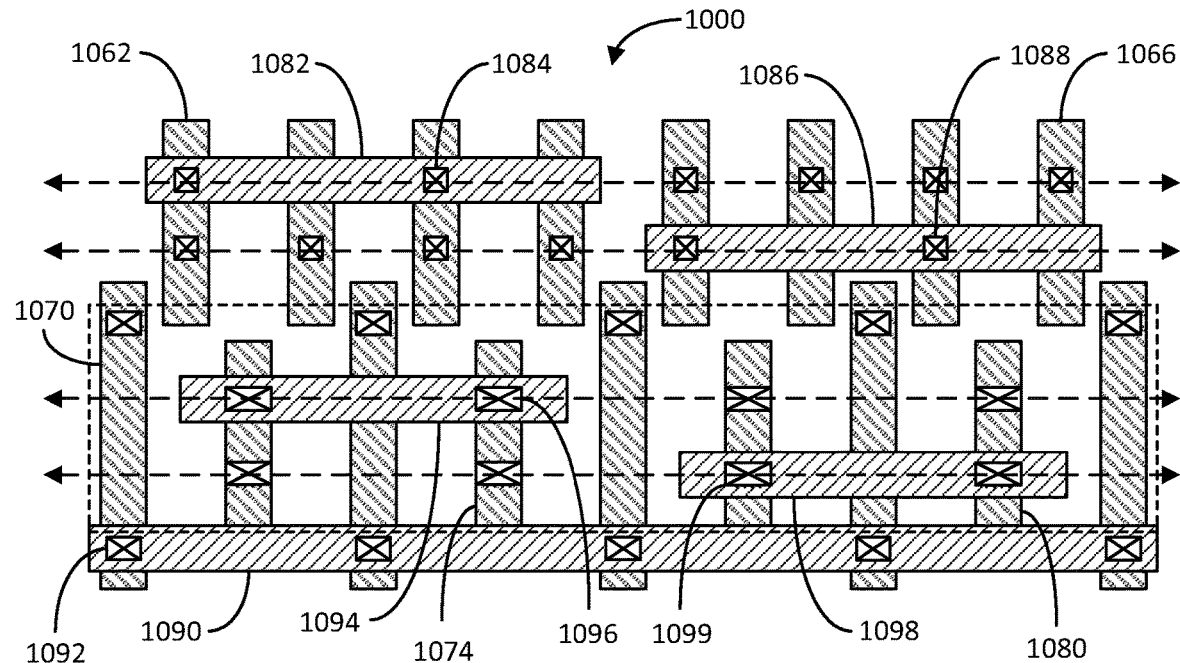

FIG. 10F illustrates a top layout view of the exemplary transistor-based cell 1000 including a fifth metal layer (M5) above the fourth metal layer M4 and the other aforementioned layers and features. In particular, the transistor-based cell 1000 includes a first M5 horizontal metal interconnect 1082 electrically coupled to the M4 vertical metal interconnects 1062 via a set of vias 1082. The transistor-based cell 1000 includes a second M5 horizontal metal gate interconnect 1086 electrically coupled to the M4 vertical metal interconnects 1066 via a set of vias 1088. The first and second sets of M5 horizontal metal gate interconnects 1082 and 1086 are configured to electrically connect the common gate or independent gates of the transistor-based cell 1000 to one or more other cells.

Similarly, the transistor-based cell 1000 includes an M5 horizontal metal interconnect 1090 electrically coupled to the M4 vertical metal interconnects 1070 via a set of vias 1092. As illustrated, the vias 1092 may be configured as non-minimum vias, such as being rectangular in shape. The M5 horizontal metal interconnect 1090 may be configured to electrically connect the transistor-based cell 1000 to one or more other cells.

The transistor-based cell 1000 includes a first M5 horizontal metal interconnect 1094 electrically coupled to the M4 vertical metal interconnects 1074 via a set of vias 1076. As illustrated, the vias 1076 may be configured as non-minimum vias, such as being rectangular in shape. The first M5 horizontal metal interconnect 1094 are configured to connect the left-side drain to one or more other cells. The transistor-based cell 1000 includes a second M5 horizontal metal interconnect 1098 electrically coupled to the M4 vertical metal interconnects 1080 via a set of vias 1099. As illustrated, the vias 1099 may be configured as non-minimum vias, such as being rectangular in shape. The second M5 horizontal metal interconnect 1098 may be configured to connect the right-drain of the analog leaf cell 1000 to one or more other cells.

Figure 11:
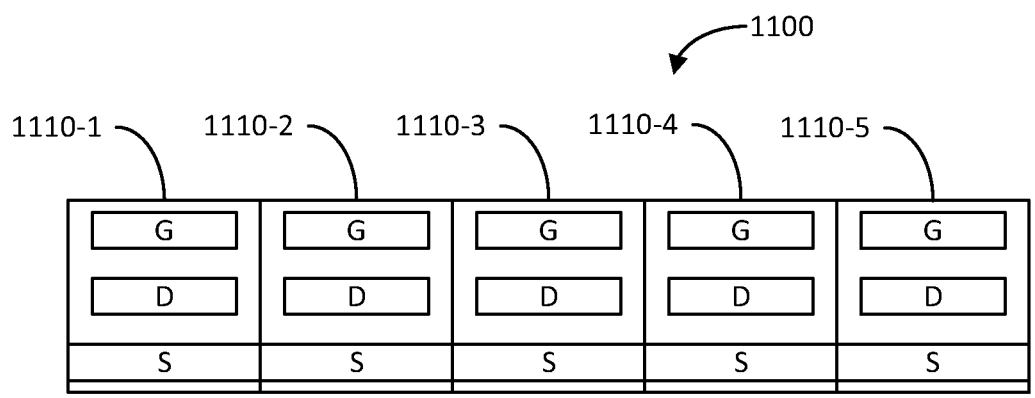
FIG. 11 illustrates a top view representation of an exemplary row of transistor-based cells in accordance with another aspect of the disclosure.

FIG. 11 illustrates a top view representation of an exemplary circuit 1100 including a row of analog leaf cells 1110-1 to 1110-5 in accordance with another aspect of the disclosure. As illustrated, adjacent analog leaf cells abut each other in the row. As discussed above with reference to analog leaf cell 1000, the source (S) of each of the analog leaf cells 1110-1 to 1110-5 extend the full width of the cell. Accordingly, when the analog leaf cells 1110-1 to 1110-5 are chained together to form the row, the source of each cell connects to the source of the adjacent cells. This forms a continuous source connection. On the other hand, the gate and drain of each of the analog leaf cells 1110-1 to 1110-5 do not extend across the entire width of the cell. Therefore, the gate and drain of each cell do not connect to the gate and drain of an adjacent cell when abutted together to form a row (and therefore, the gates and drains of adjacent cells are independent).

Figure 12:
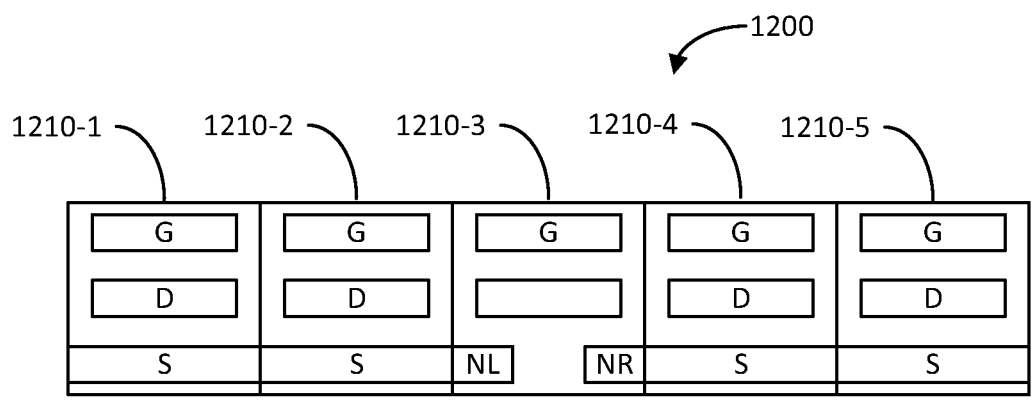
FIG. 12 illustrates a top view representation of another exemplary row of transistor cells in accordance with another aspect of the disclosure.

FIG. 12 illustrates a top view representation of another exemplary circuit 1200 including a row of transistor-based cells 1210-1 to 1210-5 in accordance with another aspect of the disclosure. As discussed with above, the source of the transistor-based cells 1000 extend the full width of the cell; and thus, when a group of transistor-based cells are chained to form a row, the sources of the transistor-based cells electrically connect. However, there are some situations where it would be desirable to have independent source connections for transistor-based cells situated in the same row, while still maintaining a continuous diffusion region.

To achieve independent source connections, a break cell is introduced in the row to separate or break the continuous source connection. In the exemplary circuit 1200, the break cell is 1210-3. As illustrated, transistor-based cells 1210-1 and 1210-2 are each modeled after transistor-based cell 1000; and therefore, include sources connected together. Similarly, transistor-based cells 1210-4 and 1210-5 are each modeled after transistor-based cell 1000; and therefore, include sources connected together.

The break cell 1210-3 includes a left source NL electrically connected to the common source of transistor-based cells 1210-1 and 1210-2. The break cell 1210-3 also includes a right source NR electrically connected to the common source of transistor-based cells 1210-4 and 1210-5. The right source NR is electrically isolated from the left source NR. The gate may be connected to a lower voltage rail vss or ground if the transistor-based cells 1210-1 to 1210-5 are configured as NMOS FETs. The gate may be connected to an upper voltage rail vdd if the transistor-based cells 1210-1 to 1210-5 are configured as PMOS FETs. The drain of the break cell 1210-3 may not be connected or left floating. An example of a scenario where independent source connections for analog leaf cells in the same row (that does not require breaking the diffusion region and adding appropriate termination, etc.) is described further herein.

Figure 13A:
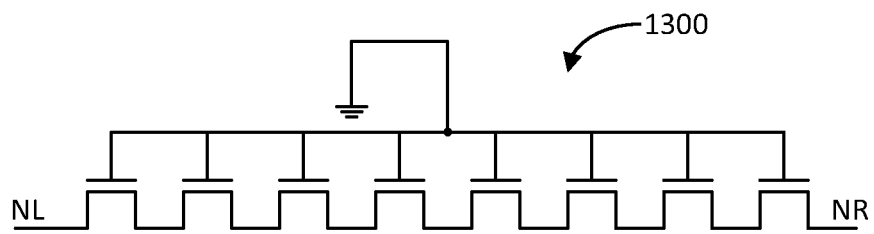
FIG. 13A illustrates of schematic diagram of an exemplary break cell in accordance with another aspect of the disclosure.

FIG. 13A illustrates of schematic diagram of an exemplary break cell 1300 in accordance with another aspect of the disclosure. The break cell 1300 is an NMOS version, and includes a set of NMOS FETs stacked together between a left source NL and a right source NR. In some implementations, the left-most source of the NMOS FETs is NL, and the right-most source of the NMOS FETs is NR. The drains of the middle NMOS FETs are connected in series. The gates are electrically connected to each other and to ground. The break cell 1300 is an example of a transistor-based cell that has a single gate connection. The PMOS version of the break cell 1300 is basically the same with the exception that the gates are tied to an upper voltage rail vdd. In both the NMOS and PMOS versions, instead of the gate being tied to vdd or ground, the gate may be tied to a high voltage or low voltage if electrical rule checking (ERC) is of concern.

Figure 13B:
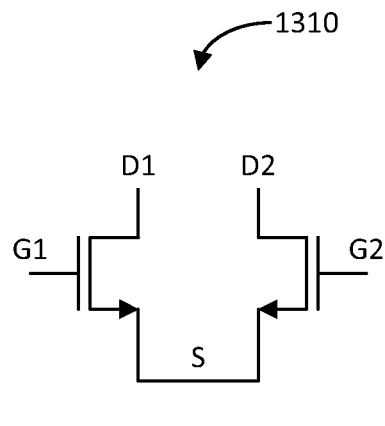
FIG. 13B illustrates a schematic diagram of an exemplary differential transistor pair cell in accordance with another aspect of the disclosure.

FIG. 13B illustrates a schematic diagram of an exemplary transistor-based cell 1310 configured as a differential transistor pair in accordance with another aspect of the disclosure. The transistor-based cell 1310 is an NMOS version, and includes a pair of NMOS FETs having independent drains connections D1 and D2, independent gate connections G1 and G2, and a common source connection S. As discussed with reference to transistor-based cell 1000 (See FIG. 10D), the M3 metal gate interconnects 1042 and 1046 do not connect to each other to achieve the independent gate connections G1 and G2. Similarly, the M3 metal drain interconnects 1054 and 1058 do not connect to each other to achieve the independent drain connections D1 and D2. The PMOS version of the transistor-based cell 1310 may be configured similar to the NMOS version.

The transistor-based cell 1310 may also be configured to form a current mirror. For example, in a current mirror, the gates G1 and G2 are electrically connected together; accordingly, in such case, the transistor-based cell has a single gate connection. The drain of one of the NMOS FETs, for example, drain D1 is electrically connected to the single gate. Thus, an input current received via drain D1 is mirrored to the drain current at drain D2. With reference to the transistor-based cell 1000 (See FIG. 10D), the M3 metal gate interconnects 1042 and 1046 electrically connect to each other to achieve a single gate connections. Similarly, one of the M3 metal drain interconnects, such as interconnect 1054, electrically connect to the gate interconnects 1042 and 1046 to achieve the current mirror configuration. In such case, the M3 metal drain interconnect 1058 remains independent of the gate and drain interconnects 1042/1046 and 1054, respectively. The PMOS current-mirror version of the analog leaf cell 1310 may be configured similar to the NMOS version.

Figure 13C:
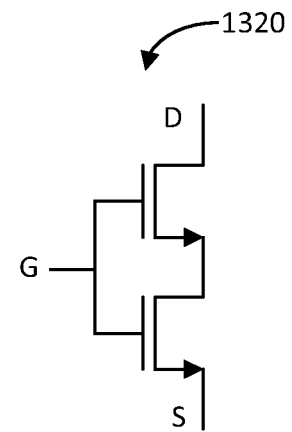
FIG. 13C illustrates a schematic diagram of an exemplary two-transistor stack cell in accordance with another aspect of the disclosure.

FIG. 13C illustrates a schematic diagram of an exemplary transistor-based cell 1320 configured as a two-transistor stack (stack-2) in accordance with another aspect of the disclosure. The two-transistor stack may be used to provide a bias voltage to other component of a circuit and/or serve as a current sink or source.

The transistor-based cell 1320 is an NMOS version, and includes a pair of NMOS FETs connected in series between a drain connection D and a source connection S. The NMOS FETs include gates electrically connected together to form a single gate connection G. With reference to transistor-based cell 1000 (See FIG. 10D), the M3 gate metal interconnects 1042 and 1046 electrically connect to each other to achieve a single gate connection. One of the M3 drain metal interconnects 1054 and 1058 electrically connect to each other to form the single drain connection D (the other serving as an intermediate drain of the stack-2). One or more of the intermediate source metal interconnects 1034 are not connected to the common source interconnect 1050 to also form the stack-2 configuration. The PMOS version of the analog leaf cell 1320 may be configured similar to the NMOS version, and may serve as to provide a bias voltage to other component of a circuit and/or serve as a current source. An 8-device cell may contain four (4) parallel instances of the stack-2 configuration.

Figure 13D:
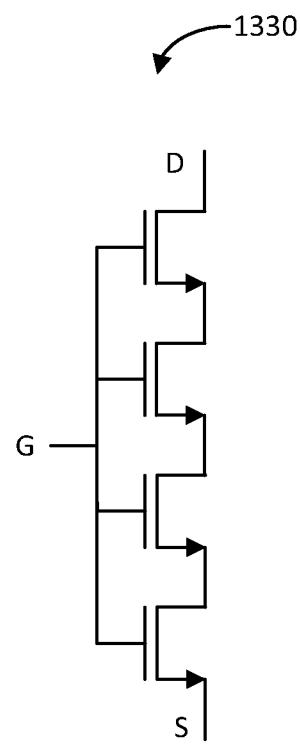
FIG. 13D illustrates a schematic diagram of an exemplary four-transistor stack cell in accordance with another aspect of the disclosure.

FIG. 13D illustrates a schematic diagram of an exemplary analog leaf cell 1330 configured as a four-transistor stack (stack-4) in accordance with another aspect of the disclosure. The four-transistor stack may be used to provide a bias voltage to other component of a circuit and/or serve as a current sink or source. It is basically the same as the two-transistor stack but may have a larger effective channel length. Stacking devices is analogous to increasing the channel length, but is not exactly the same in terms of performance. For example, a 40 nm stack-2 configuration may perform better than an 80 nm gate length device. However, it will take up more area because of the extra gate spacing (i.e., difference between poly pitch CPP and gate length).

In particular, the transistor-based cell 1330 is an NMOS version, and includes a four (4) NMOS FETs connected in series between a drain connection D and a source connection S. The NMOS FETs include gates electrically connected together to form a single gate connection G. With reference to analog leaf cell 1000 (See FIG. 10D), the M3 metal gate interconnects 1042 and 1046 electrically connect to each other to achieve a single gate connections. Similarly, half of one of the M3 drain metal interconnects 1054 and 1058 serves as the single drain connection D (the others serving as the intermediate drains of the stack-4). Two or more of the intermediate source interconnects 1034 are not connected to the common source interconnect 1050 to form the stack-4 configuration. The PMOS version of the transistor-based cell 1330 may be configured similar to the NMOS version, and may serve as to provide a bias voltage to other component of a circuit and/or serve as a current source. An 8-device cell may contain two (2) parallel instances of the stack-2 configuration.

Figure 13E:
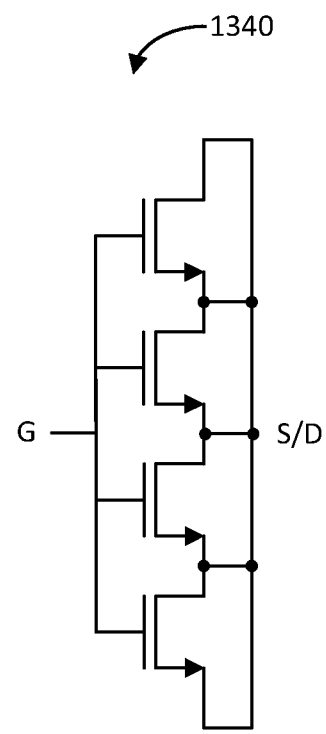
FIG. 13E illustrates a schematic diagram of an exemplary dummy cell in accordance with another aspect of the disclosure.

FIG. 13E illustrates a schematic diagram of an exemplary dummy cell 1340 in accordance with another aspect of the disclosure. The dummy cell 1340 may be used at ends of a row of transistor-based cells so that the operational transistors of the transistor-based cells have substantially the same threshold voltage. As previously discussed, the transistor-based cell 1000 includes a diffusion region 1002 that extends the entire width of the cell. Accordingly, when transistor-based cells are abutted to form a row of cells, a continuous diffusion region forms along the row. Generally, transistors near the ends of the rows have threshold voltages that may deviate from the threshold voltages of the transistors therebetween. Thus, dummy cells 1340 including non-operational transistors are placed near the ends of a row of cells to ensure that the operational transistors therebetween have a more uniform threshold voltage.

More specifically, the dummy cell 1340 may include a set of NMOS FETS having their source (S) and drains (D) electrically connected together, and a gate (G) that is floating. With reference to analog leaf cell 1000 (See FIG. 10D), the M3 gate metal interconnects 1042 and 1046 may be electrically connected to each other and to nothing else to achieve a floating gate. The M3 drain metal interconnects 1054 and 1058 are electrically connected to the M3 source metal interconnect 1050. The PMOS version of the analog leaf cell 1340 may be configured similar to the NMOS version.

Figures 13F, 13G:
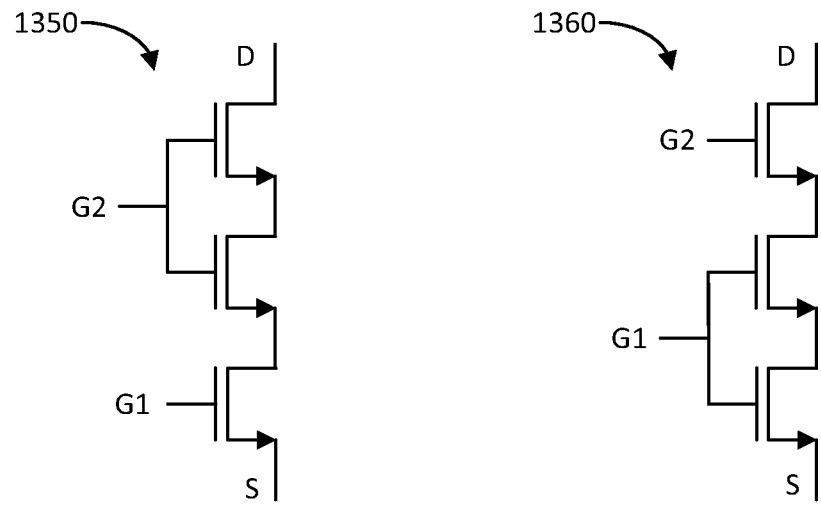
FIG. 13F illustrates a schematic diagram of an exemplary two-transistor stack with enable cell in accordance with another aspect of the disclosure.
FIG. 13G illustrates a schematic diagram of an exemplary two-transistor stack cell with cascode cell in accordance with another aspect of the disclosure.

FIG. 13F illustrates a schematic diagram of an exemplary transistor-based cell 1350 including a two-transistor stack with enable circuit cell in accordance with another aspect of the disclosure. The two-transistor stack with enable may be used to provide a selectable (on or off) bias voltage to other component of a circuit and/or serve as a selectable current sink or source.

The transistor-based cell 1350 is an NMOS version, and includes three (3) NMOS FETs connected in series between a drain connection D and a source connection S. Two of the NMOS FETs include gates electrically connected together to form a single gate connection G. Another of the NMOS FET includes a gate configured to receive an enable/disable signal. With reference to transistor-based cell 1000 (See FIG. 10D), the M3 gate metal interconnects 1042 and 1046 may not be electrically connected to each other to form the independent gate connections G1 and G2. Similarly, the M3 metal drain interconnect 1054 and 1058 are not electrically connected to each other so that a series connection is formed between the drain and the source. In this regard, two or more of the intermediate source interconnects 1034 are not connected to the common source interconnect 1050 to form the stack configuration. The PMOS version of the transistor-based cell 1350 may be configured similar to the NMOS version, and may serve to provide a selectable bias voltage to other component of a circuit and/or serve as a selectable current source.

FIG. 13G illustrates a schematic diagram of an exemplary transistor-based cell 1360 including a two-transistor stack with a cascode transistor in accordance with another aspect of the disclosure. The two-transistor stack with cascode may be used to provide a cascode amplification stage.

The transistor-based cell 1360 is an NMOS version, and includes three (3) NMOS FETs connected in series between a drain connection D and a source connection S. Two of the NMOS FETs include gates electrically connected together to form a single gate connection G. Another of the NMOS FET includes a gate configured to receive a cascode bias signal. With reference to transistor-based cell 1000 (See FIG. 10D), the M3 metal gate interconnects 1042 and 1046 may not be electrically connected to each other to form the independent gate connections G1 and G2. Similarly, the M3 metal drain interconnect 1054 and 1058 are not electrically connected to each other so that a series connection is formed between the drain and the source. In this regard, two or more of the intermediate source interconnects 1034 are not connected to the common source interconnect 1050 to form the stack configuration. The PMOS version of the analog leaf cell 1360 may be configured similar to the NMOS version.

Figure 13H:
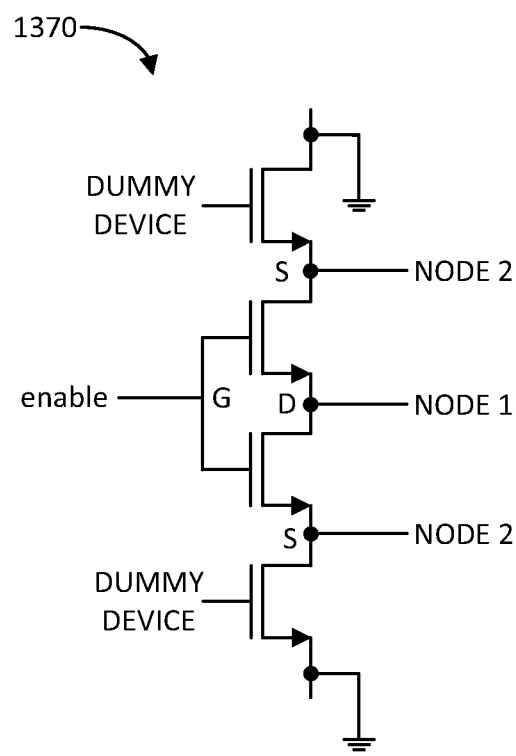
FIG. 13H illustrates a schematic diagram of an exemplary foot switch cell in accordance with another aspect of the disclosure.

FIG. 13H illustrates a schematic diagram of an exemplary analog leaf cell 1360 including a first dummy device, a two-transistor stack, and a second dummy device in accordance with another aspect of the disclosure. The two-transistor stack may serve as a switch to selectively connect a first node to a second node, without requiring the source or drain to be connected to ground. This arrangement also allows for easy abutment of the switch cell to other cells in a row that share the outer S/D connection of the dummy devices.

The transistor-based cell 1370 is an NMOS version, and includes four (4) NMOS FETs connected in series. The first (top) and the last (bottom) NMOS FETs are configured as dummy devices, each having a source/drain coupled to ground and a gate floating. The two intermediate NMOS FETs include a common gate (G) configured to receive an enable signal, a drain connection coupled to a first node (NODE 1), and a source coupled to a second node (NODE 2). With reference to transistor-based cell 1000 (See FIG. 10D), the M3 gate metal interconnects may be reconfigured to electrically connect the gates of intermediate transistors together, while not connecting to the gates of the transistors at the opposite ends of the cell. The intermediate gate serves as the gate connection for receiving the enable signal. The M3 metal drain interconnects 1054 and 1058 may be connected to the first node. The intermediate source interconnects 1034 may be connected to the second node. The sources at the opposite ends of the cell 1000 may be coupled to ground and/or the bulk. The PMOS version of the analog leaf cell 1370 may be configured similar to the NMOS version.

Figure 14:
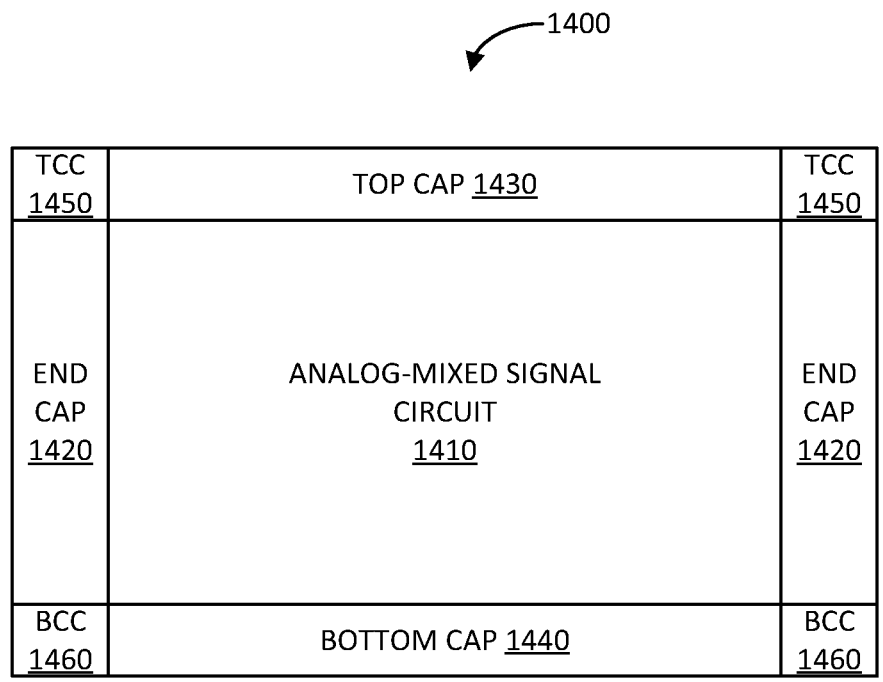
FIG. 14 illustrates a top view representation of an exemplary analog circuit with terminations in accordance with another aspect of the disclosure.

FIG. 14 illustrates a top view representation of an exemplary circuit 1400 with terminations (or transitions) in accordance with another aspect of the disclosure. The circuit 1400 includes an analog-mixed signal (AMS) circuit 1410 including a set of one or more rows of analog-mixed signal transistor-based cells. The circuit 1400 further includes endcaps 1420 on opposite sides of the AMS circuit 1410. The endcaps 1420 provide a structure for properly terminating the diffusion region for each of the one or more rows of transistor-based cells of the AMS circuit 1410, and also electrically isolates the AMS circuit 1410 from other neighboring circuits.

The top and bottom caps 1430 and 1440 also provide termination or transition structure for electrically isolating the AMS circuit 1410 from other neighboring circuits. Similarly, top and bottom corner cells (TCC) 1450 and (BCC) 1460 on opposite sides of the top and bottom caps 1430 and 1440, respectively, also electrically isolate the AMS circuit 1410 from other neighboring circuits, as well as to provide well ties or sub ties as needed.

Figure 15:
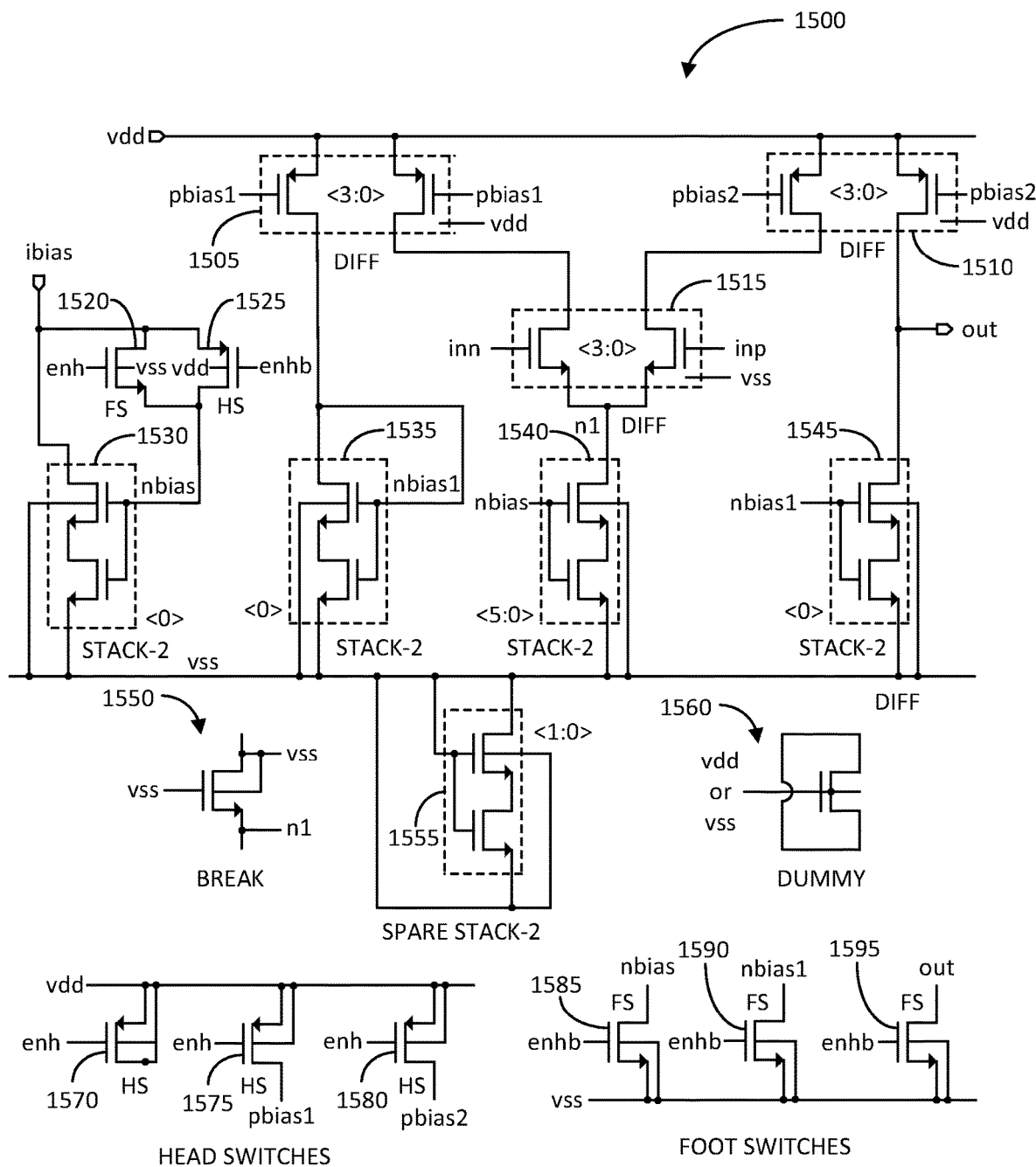
FIG. 15 illustrates a schematic diagram of an exemplary operational amplifier circuit with terminations in accordance with another aspect of the disclosure.

FIG. 15 illustrates a schematic diagram of an exemplary analog circuit 1500 in accordance with another aspect of the disclosure. The analog circuit 1500 is configured as an operational amplifier, and serves as one example of the analog leaf (transistor-based) cells be configured and arranged together to form an operational analog circuit. It shall be understood that many other types of analog circuits may be formed by configuring and arranging transistor-based cells described herein.

In particular, the operational amplifier 1500 includes a first current mirror 1505, a second current mirror 1510, a differential transistor pair 1515, and stack-2 bias circuits 1535, 1540, and 1545. Additionally, the operational amplifier 1500 includes a fourth stack-2 bias circuit 1530 and an associated enable circuit including foot switch (FS) 1520 and head switch (HS) 1525. Further, the operational amplifier 1500 includes a set of head switches (HS) 1570, 1575, and 1580, and a second of foot switches (FS) 1585, 1590, and 1595. Also, for layout purposes, as discussed in more detail herein, the operational amplifier 1500 further includes a set of break cells (B) 1550, and a set of dummy cells (D) 1566. The operational amplifier 1500 may include a spare stack-2 bias circuit 1555.

More specifically, the first current mirror 1505 includes four instantiations <3:0> of a pair of PMOS FETs with sources coupled to upper voltage rail vdd, and gates configured to receive a bias voltage pbias1. The bulk of the PMOS FETs is tied to the upper voltage rail vdd. The first stack-2 bias circuit 1535 includes a single instantiation <0> of a pair of NMOS FETs coupled in series between the drain of the left PMOS FET of the first current mirror 1505 and a lower voltage rail vss. The drain of the upper NMOS FET of the first stack-2 bias circuit 1535 is coupled to the gates of the NMOS FETs to form a bias voltage nbias1 at the gates of such devices. The bulk of the NMOS FETs of the first stack-2 bias circuit 1535 is coupled to the lower voltage rail vss.

Similarly, the second current mirror 1510 includes four instantiations <3:0> of a pair of PMOS FETs with sources coupled to upper voltage rail vdd, and gates configured to receive a bias voltage pbias2. The bulk of the PMOS FETs is tied to the upper voltage rail vdd. The second stack-2 bias circuit 1545 includes a single instantiation <0> of a pair of NMOS FETs coupled in series between the drain of the right PMOS FET of the second current mirror 1510 and the lower voltage rail vss. The gates of the NMOS FETs are configured to receive the bias voltage nbias1 from the first stack-2 bias circuit 1535. The bulk of the NMOS FETs of the second stack-2 bias circuit 1545 is coupled to the lower voltage rail vss.

The differential transistor pair 1515 includes four instantiations <3:0> of a pair of NMOS FETs including drains coupled to the drains to the respective drains of the right and left PMOS FETs of the first and second current mirrors 1505 and 1510, respectively. The pair of NMOS further includes gates configured to receive negative and positive components inn and inp of an input differential signal. The pair of NMOS further includes sources coupled together at a node n1. The bulk of the NMOS FETs of the differential transistor pair 1515 is coupled to the lower voltage rail vss.

The third stack-2 bias circuit 1540 includes six (6) instantiations <5:0> of a pair of NMOS FETs coupled in series between the sources (at node n1) of the differential NMOS FETs of the differential transistor pair 1515 and the lower voltage rail vss. The gates of the NMOS FETs are configured to receive the bias voltage nbias from the fourth stack-2 bias circuit 1530. The bulk of the NMOS FETs of the third bias circuit 1540 is coupled to the lower voltage rail vss.

The fourth stack-2 bias circuit 1530 includes a pair of NMOS FETs coupled in series between a source of a bias voltage ibias and the lower voltage rail. The gates of the NMOS FETs are coupled together and to source and drain of foot switch (FS) 1520 and head switch (HS) 1525, respectively. The foot switch (FS) 1520 is configured as an NMOS FET with drain coupled to the ibias voltage source, and a gate configured to receive an enable signal enh. The head switch (HS) 1525 includes a source coupled to the ibias voltage source, and a gate configured to receive a complementary enable signal enhb. The bulk of the NMOS FETs of the fourth stack-2 bias circuit 1530 is coupled to the lower voltage rail vss.

The first head switch (HS) 1570 of the set is configured as a PMOS FET including a source coupled to the upper voltage rail vdd, a gate configured to receive the enable signal enh, and a drain coupled to the upper voltage rail vdd. The second head switch (HS) 1575 of the set is also configured as a PMOS FET including a source coupled to the upper voltage rail, a gate configured to receive the enable signal enh, and a drain coupled to the gates of the PMOS FETs of the first current mirror 1505 for supplying the bias voltage pbias1 thereto. The third head switch (HS) 1580 of the set is also configured as a PMOS FET including a source coupled to the upper voltage rail, a gate configured to receive the enable signal enh, and a drain coupled to the gates of the PMOS FETs of the second current mirror 1510 for supplying the bias voltage pbias2 thereto. The bulk of the PMOS FETs 1570, 1575, and 1580 are coupled to the upper voltage rail vdd.

The first foot switch (FS) 1585 of the set is configured as an NMOS FET including a source coupled to the lower voltage rail vss, a gate configured to receive the complementary enable signal enhb, and a drain coupled to the gates of the fourth stack-2 bias circuit 1530. The second foot switch (FS) 1590 of the set is also configured as a NMOS FET including a source coupled to the lower voltage rail vss, a gate configured to receive the complementary enable signal enhb, and a drain coupled to the gates of the first and second stack-2 bias circuits 1535 and 1545. The third foot switch (FS) 1595 of the set is also configured as an NMOS FET including a source coupled to the lower voltage rail vss, a gate configured to receive the complementary enable signal enhb, and a drain coupled to an output node of the operational amplifier 1500 (at the node between the second current mirror 1510 and the second stack-2 bias circuit 1545). The bulk of the NMOS FETs 1585, 1590, and 1595 are coupled to the lower voltage rail vss.

The break cell 1550 may be configured as a PMOS or an NMOS FET depending on whether it is employed in a row of PMOS-based cells or NMOS-based cells, respectively. In this example, since the break cell 1550 is used in a row of NMOS-based cells, the break cell 1550 is configured as an NMOS FET including a first drain/source coupled to the lower voltage rail vss, a second drain/source coupled to node n1 (the source of the NMOS FETs of the differential transistor pair 1515), and a gate and bulk coupled to the lower voltage rail vss. If the break cell 1550 was employed in a row of PMOS-based cells, the break cell 1550 would be configured as a PMOS FET with the sources/drains coupled to the independent sources of the row of cells, and the gate and bulk couple do the upper voltage rail vdd.

The dummy cell 1560 may be configured as a PMOS or an NMOS FET depending on whether it is employed in a row of PMOS-based cells and NMOS-based cells, respectively. The FET includes a gate coupled to the bulk. In the case of a PMOS FET, the gate and bulk of the FETs are coupled to the upper voltage rail vdd. In the case of an NMOS FET, the gate and bulk of the FETs are coupled to the lower voltage rail vss. In both cases, the source and drains are electrically connected together.

The spare stack-2 bias circuit 1555 includes two instantiations <1:0> of a pair of NFETs coupled in series between the lower voltage rail vss, with their gates also coupled to the lower voltage rail vss. The spare bias circuit 1555 is not operational, but can be made operational by a simple redesign or reconfiguration of the connections to the spare bias circuit 1555. As an example, if a wider channel device is required for the first stack-2 bias circuit 1535, the first instantiation of the spare stack-2 bias circuit 1555 may be coupled in parallel with the first stack-2 bias circuit 1535; for example, by connecting the common drain/gates of the spare stack-2 bias circuit 1555 to the common drain/gates of the first stack-2 bias circuit 1535. Similarly, if a wider channel device is required for the second bias circuit 1545, the second instantiation of the spare stack-2 bias circuit 1555 may be coupled in parallel with the second stack-2 bias circuit 1545; for example, by connecting the drain and gates of the spare stack-2 bias circuit 1555 to the drain and gates of the second bias circuit 1545.

Figure 16A:
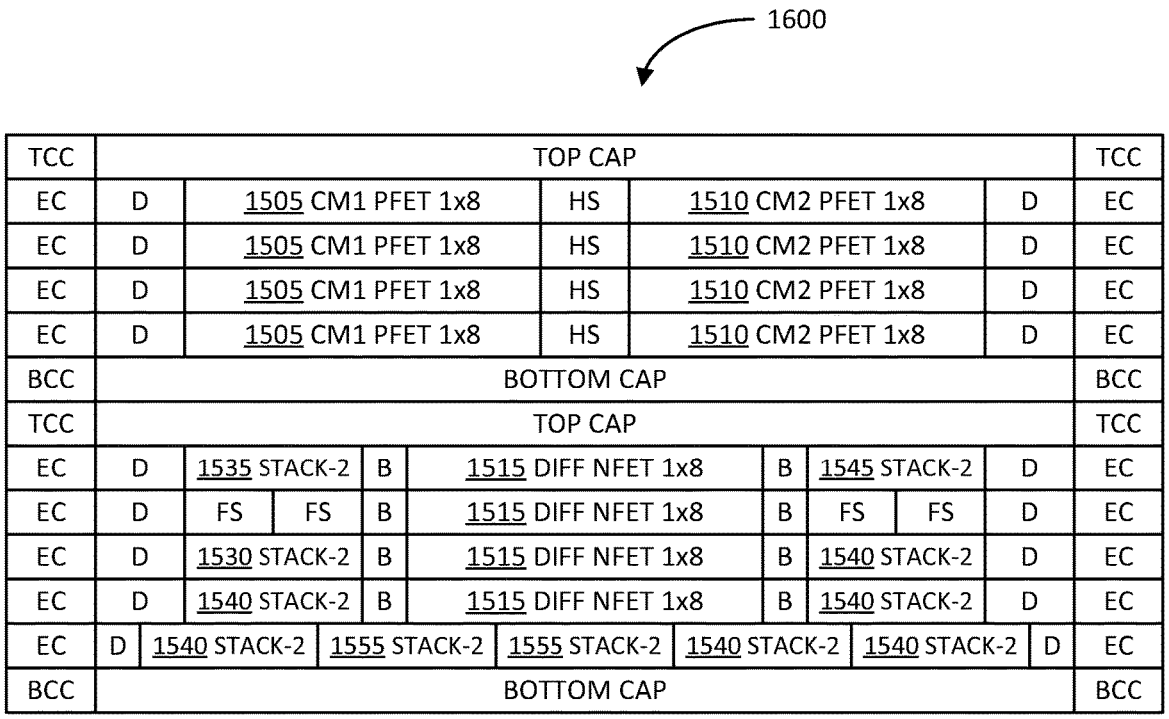
FIG. 16A illustrates a top layout view of the exemplary operational circuit of FIG. 15 in accordance with another aspect of the disclosure.

FIG. 16A illustrates a top layout view of the exemplary analog circuit 1600 in accordance with another aspect of the disclosure. The analog circuit 1600 is an exemplary layout representation of the operational amplifier 1500 previously discussed.

From left-to-right and top-to-bottom, the analog circuit 1600 includes a first row including a left top corner cell (TCC), a top cap, and a right top corner cell (TCC), as previously discussed. The second row includes a left endcap, at least one dummy cell (D), the first instantiation of the first current mirror 1505 with a height of one (1) (the minimum number of fins (e.g., 4 fins)) and a width of eight (8) devices (1×8), the head switch (HS) 1570, the first instantiation of the second current mirror 1510 (1×8), at least dummy cell (D), and a right endcap (EC).

The third, fourth, and fifth rows are configured similar to the second row, including: left endcaps (EC), dummy cells (D), first current mirror 1505 (second, third, and fourth instantiations), head switches (1575, 1580, and 1525), second current mirror 1510 (second, third, and fourth instantiations), dummy cells (D), and right endcaps (EC). The sixth row includes a left bottom corner cell (BCC), a bottom cap, and a right bottom corner cell (BCC). Accordingly, the aforementioned six (6) rows pertain to rows of PMOS-based analog leaf cells.

The analog circuit 1600 further includes a seventh row including a left top corner cell (TCC), a top cap, and a right top corner cell (TCC), as previously discussed. This row is the beginning of the rows of NMOS-based analog leaf cells. The eighth row includes a left endcap, at least one dummy cell (D), the first stack-2 bias circuit 1535 (1×4), a left break cell (B), the first instantiation of the differential transistor pair 1515 (1×8), a right break cell (B), the second stack-2 bias circuit 1545 (1×4), at least one dummy cell (D), and a right endcap (EC). In this case, the left- and right-break cells (B) are used to isolate the sources of the differential transistor pair 1515 (which at node n1) from the sources of the first and second stack-2 bias circuits 1535 and 1545 (which is at vss).

The ninth row includes a left endcap, at least one dummy cell (D), foot switches (FS) 1525 and 1585, a left break cell (B), the second instantiation of the differential transistor pair 1515 (1×8), a right break cell (B), foot switches (FS) 1590 and 1595, at least one dummy cell (D), and a right endcap (EC). The tenth row includes a right endcap (EC), at least one dummy cell (D), the fourth stack-2 bias circuit 1530, a left break cell (B), the third instantiation of the differential transistor pair 1515 (1×8), a right break cell (B), the first instantiation of the third stack-2 bias circuit 1540, at least one dummy cell (D), and a right endcap (EC).

The eleventh row includes a left endcap (EC), at least one dummy cell (D), the second instantiation of the third stack-2 bias circuit 1540, a left break cell (B), the fourth instantiation of the differential transistor pair 1515 (1×8), a right break cell (B), the third instantiation of the third stack-2 bias circuit 1540, at least one dummy (D), and a right endcap (EC). The twelfth row includes a left endcap (EC), at least one dummy cell (D), the fourth instantiation of the third bias circuit 1540, a first instantiation of the spare stack-2 bias circuit 1555, a second instantiation of the spare stack-2 bias circuit 1555, the fifth instantiation of the third stack-2 bias circuit 1540, the sixth instantiation of the third stack-2 bias circuit 1540, at least one dummy cell (D), and a right endcap (EC). The thirteenth row includes a left bottom corner cell (BCC), a bottom cap, and a right bottom corner cell (BCC).

As this example illustrates, the layout 1600 of the operational amplifier 1500 is rectangular in-shape, and organized in a plurality of rows of analog transistor-based leaf cells and terminations. The height Y of each of the rows is a multiple integer of the fin pitch (FP). In this example, the height Y of each of the rows may be 16 or 32 fins multiplied by the fin pitch (FP). Although, in this example, the height of each of the rows are substantially the same, it shall be understood that the height of the rows may vary, but they may still an integer multiple of the fin pitch (FP).

Similarly, to achieve the rectangular configuration of the layout 1600, the width of the analog transistor-based leaf cells and terminations are configured to have the same cumulative width. Further, the analog transistor-based leaf cells may have a width being a multiple integer of the poly pitch (CPP). For example, with reference to the second through fifth rows, the dummy cells (D) may each have a width of four (4) polysilicon gates, the first and second current mirrors 1505 and 1510 may each have a width of eight (8) polysilicon gates, and the head switch (HS) may have a width of four (4) polysilicon gates. Thus, the cumulative width of each of the second through fifth rows is 28 polysilicon gates multiplied by the poly pitch (CPP) plus the width of two endcaps (EC).

With reference to the eighth, tenth, and eleventh rows, the dummy cells (D) each may have a width of four (4) polysilicon gates, the stack-2 bias circuits 1530, 1535, 1540, and 1545 may each have a width of four (4) polysilicon gates, the differential transistor pair cell 1515 may have a width of eight (8) polysilicon gates, and the break cells (B) may each have a width of two (2) polysilicon gates. Thus, the cumulative width of each of the second through fifth rows is 28 polysilicon gates multiplied by the poly pitch (CPP) plus the width of two endcaps (EC). Thus, the cumulative width of each of the eighth, tenth, and eleventh rows is 28 polysilicon gates multiplied by the poly pitch (CPP) plus the width of two endcaps (EC).

Similarly, with reference to the ninth row, the dummy cells (D) may each have a width of four (4) polysilicon gates, the foot switches (FS) may each have a width of two (2) polysilicon gates, the differential transistor pair cell 1515 may have a width of eight (8) polysilicon gates, and the break cells (B) may each have a width of two (2) polysilicon gates. Thus, the cumulative width of the ninth row is 28 polysilicon gates multiplied by the poly pitch (CPP) plus the width of two endcaps (EC). Thus, the cumulative width of the ninth row is 28 polysilicon gates multiplied by the poly pitch (CPP) plus the width of two endcaps (EC). The top cap, bottom cap, and corner cells may each be configured to have a height of 16 fins and a width of 28 polysilicon gates.

Based on the above description of the height and width of the rows, the total width of the layout 1600 is 28 polysilicon gates multiplied by the poly pitch (CPP) plus the width of two endcaps. The height of the layout 1600 is 13 rows multiplied by 16 fins multiplied by the fin pitch (FP). Thus, the layout 1600 is rectangular and organized in rows having the substantially the same height, but may also be configured to have different heights each being a multiple integer of the fin pitch (FP). This uniform and organized structure generally produces integrated circuits with improved manufacturing yields, and is structured similar to the digital core portion of an integrated circuit.

Figure 16B:
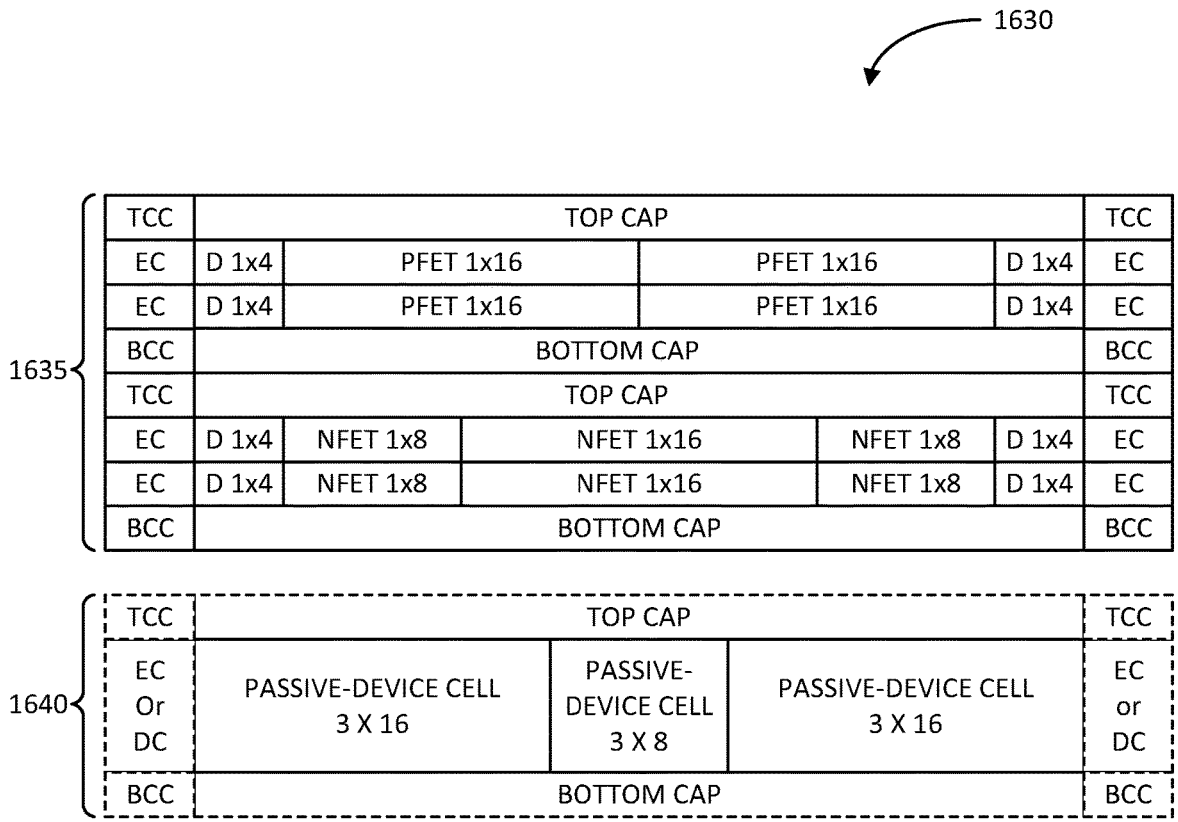

FIG. 16B illustrates a top layout view of an exemplary circuit 1630 including an array of transistor-based cells 1635 juxtaposed with an array of passive-device cells 1640 in accordance with another aspect of the disclosure. The array of transistor-based cells 1635 includes eight (8) single-height (e.g., 16 fin height) rows. In particular, the array of transistor-based cells 1635 includes two rows of PFET-based cells with an associated top cap situated between a pair of top corner cells (TCCs), and an associated bottom cap situated between a pair of bottom corner cells (BCCs). The array of transistor-based cells 1635 further includes two rows of NFET-based cells with an associated top cap situated between a pair of top corner cells (TCCs), and an associated bottom cap situated between a pair of bottom corner cells (BCCs).

The width of each of the transistor-based cell rows, excluding the endcaps (ECs), is 40 CPP. For example, from left-to-right, the two rows of the PFET-based cells each includes a left-dummy cell with a width of four (4) CPP, a PFET-based cell with a width of 16 CPP, another PFET-based cell with a width of 16 CPP, and a right-dummy cell with a width of four (4) CPP. Also, from left-to-right, the two rows of the NFET-based cells each includes a left-dummy cell with a width of four (4) CPP, an NFET-based cell with a width of eight (8) CPP, another NFET-based cell with a width of 16 CPP, another NFET-based cell with a width of eight (8) CPP, and a right-dummy cell with a width of four (4) CPP.

The array of passive-device cells 1640 includes three (3) rows with an optional top cap, a row with three (3) passive-device cells, and an optional bottom cap. If the passive-device cells are configured as resistor-based cells, top and bottom caps may be included with a dummy cell (instead of an endcap (EC)) on either side of the row of passive-device cells. Optionally, the resistor-based array may be implemented with corresponding top and bottom corner cells (TCC/BCC). If, on the other hand, the passive-device are configured as capacitor-based cells, endcaps (ECs) and top and bottom caps (TCC/BCC) are not required, but may include a guard ring around the array 1640 (which is generally implemented anyway for most array types).

The row of passive-device cells has a height of three (3) times the single-height of a transistor-based cell (e.g., 3×16 fins or 48 fins). From left-to-right, the left passive-device cell has a width of 16 CPP, the middle passive-device cell has a width of eight (8) CPP, and the right passive-device cell has a width of 16 CPP. Accordingly, the width of the row of passive-device cells, excluding the endcaps (ECs), is 40 CPP; i.e., the same as the width of the rows of PFET- and NFET-based cells, excluding the endcaps (ECs), of the array of transistor-based cells 1635.

This facilitates tiling the array of passive-device cells 1640 with the array of transistor-based cells 1635. In other words, the right- and left-boundaries of the array of passive-device cells 1640 are substantially colinear (in the polysilicon longitudinal direction) with the right- and left-boundaries of the array of transistor-based cells 1635, respectively. As an array of passive-device cells may often be larger than an array of transistor-based cells, the right- and left-boundaries of the array of passive-device cells may be colinear with the right- and left-boundaries of different arrays of transistor-based cells and/or other passive device cells.

FIG. 16C illustrates a top layout view of another exemplary circuit 1660 including an array of transistor-based cells 1665 juxtaposed with an array of passive-device cells 1670 in accordance with another aspect of the disclosure. The array of transistor-based cells 1665 includes 10 rows. In particular, the array of transistor-based cells 1665 includes two rows of single-height (e.g., 16 fins) PFET-based cells and a row of double-height (e.g., 32 fins) PFET-based cells with an associated top cap situated between a pair of top corner cells (TCCs), and an associated bottom cap situated between a pair of bottom corner cells (BCCs).

The array of transistor-based cells 1665 further includes a row of triple-height NFET-based cells and two rows of single-height NFET-based cells with an associated top cap situated between a pair of top corner cells (TCCs), and an associated bottom cap situated between a pair of bottom corner cells (BCCs).

The width of each of the transistor-based cell rows, excluding the endcaps (ECs), is 40 CPP. For example, from left-to-right, each of the rows of the PFET-based cells includes a left-dummy cell with a width of four (4) CPP, a PFET-based cell with a width of 16 CPP, another PFET-based cell with a width of 16 CPP, and a right-dummy cell with a width of four (4) CPP.

Also, from left-to-right, the double-height NFET-based cell row includes a left-dummy cell with a width of four (4) CPP, a NFET-based cell with a width of 16 CPP, another NFET-based cell with a width of 16 CPP, and a right-dummy cell with a width of four (4) CPP. Each of the rows of the single-height NFET-based cells includes a left-dummy cell with a width of four (4) CPP, an NFET-based cell with a width of eight (8) CPP, another NFET-based cell with a width of 16 CPP, another NFET-based cell with a width of eight (8) CPP, and a right-dummy cell with a width of four (4) CPP.

The array of passive-device cells 1670 includes five (5) rows with an optional top cap, three (3) rows each with a single passive-device cell, and an optional bottom cap. If the passive-device cells are configured as resistor-based cells, top and bottom caps may be included with a dummy cell (instead of an endcap (EC)) on either side of each row of passive-device cells. Optionally, the resistor-based array may be implemented with corresponding top and bottom corner cells (TCC/BCC). If, on the other hand, the passive-device are configured as capacitor-based cells, endcaps (ECs) and top and bottom caps (TCC/BCC) are not required, but may include a guard ring around the array 1670.

Each of the passive-device cells has a width of 16 CPPs. The upper passive-device cell has a height of four (4) times the single-height of a transistor-based cell (e.g., 4×16 fins or 64 fins); the middle passive-device cell has a height of three (3) times the single-height of a transistor-based cell (e.g., 3×16 fins or 48 fins); and the lower passive-device cell has a height of four (4) times the single-height of a transistor-based cell (e.g., 4×16 fins or 64 fins). Thus, the height of the passive-device cell array 1670, is 13 times the single-height transistor-based cell (e.g., 13×16 fins or 208 fins). The height of the transistor-based cell array 1665 is also 13 times the single-height transistor-based cell.

This facilitates tiling the array of passive-device cells 1670 with the array of transistor-based cells 1665. In other words, the upper- and lower-boundaries of the array of passive-device cells 1670 are substantially colinear (in the fin longitudinal direction) with the upper- and lower-boundaries of the array of transistor-based cells 1665, respectively. As an array of passive-device cells may often be larger than an array of transistor-based cells, the upper- and lower-boundaries of the array of passive-device cells may be colinear with the upper- and lower-boundaries of different arrays of transistor-based cells and/or other passive device cells.

Figure 17A:
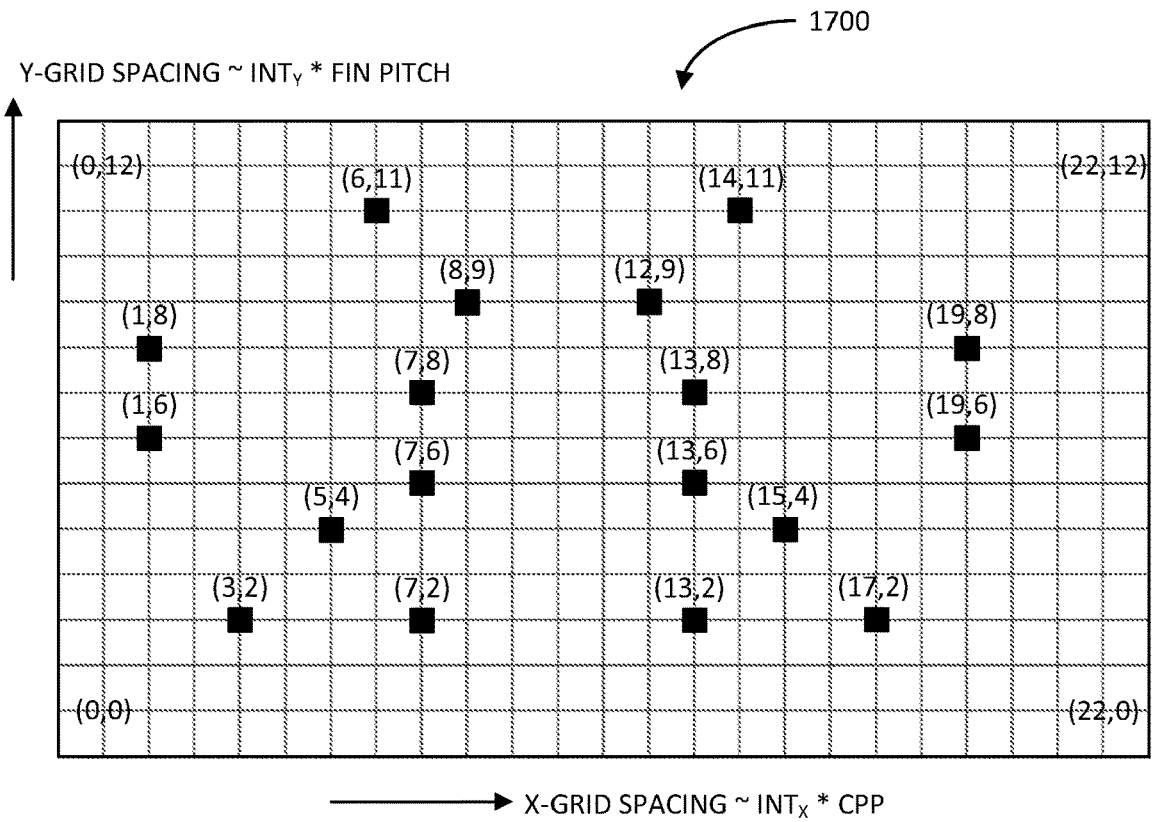
FIG. 17A-17C illustrate diagrams of an exemplary interconnect routing coordinate system in accordance with another aspect of the disclosure.
Figure 17B:
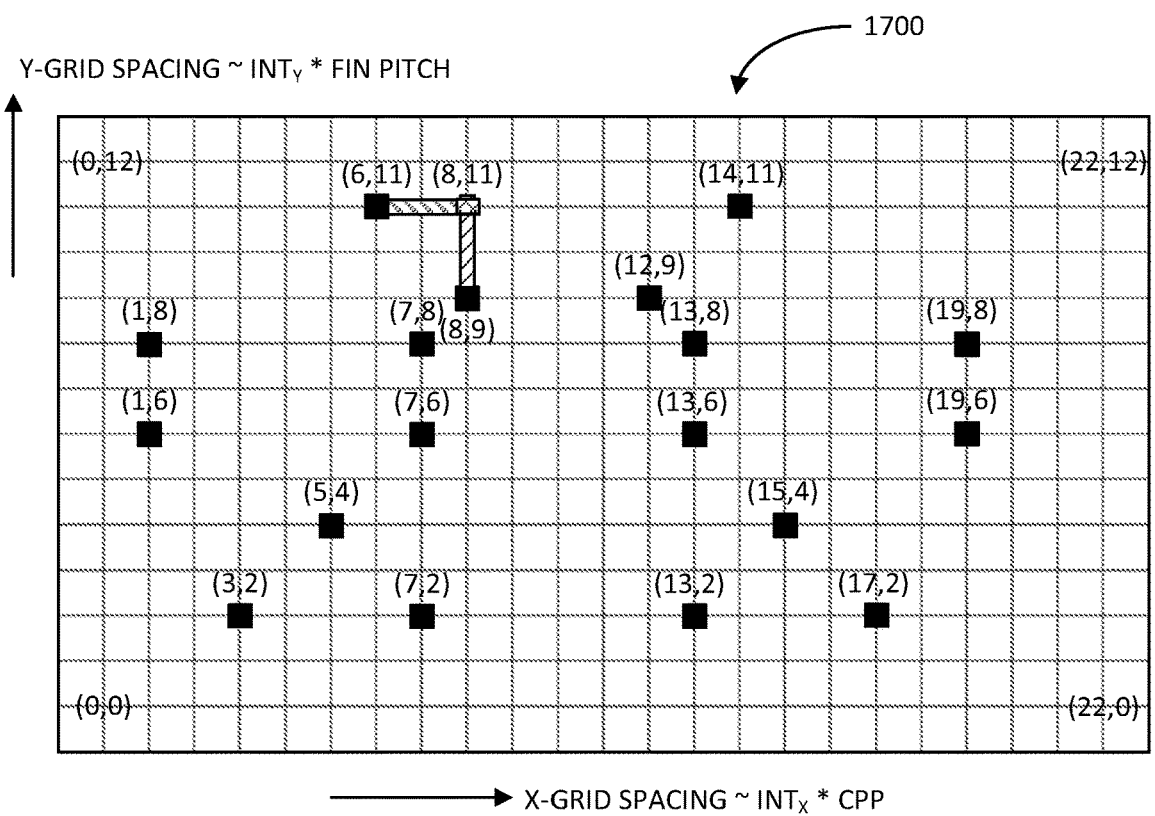
Figure 17C:
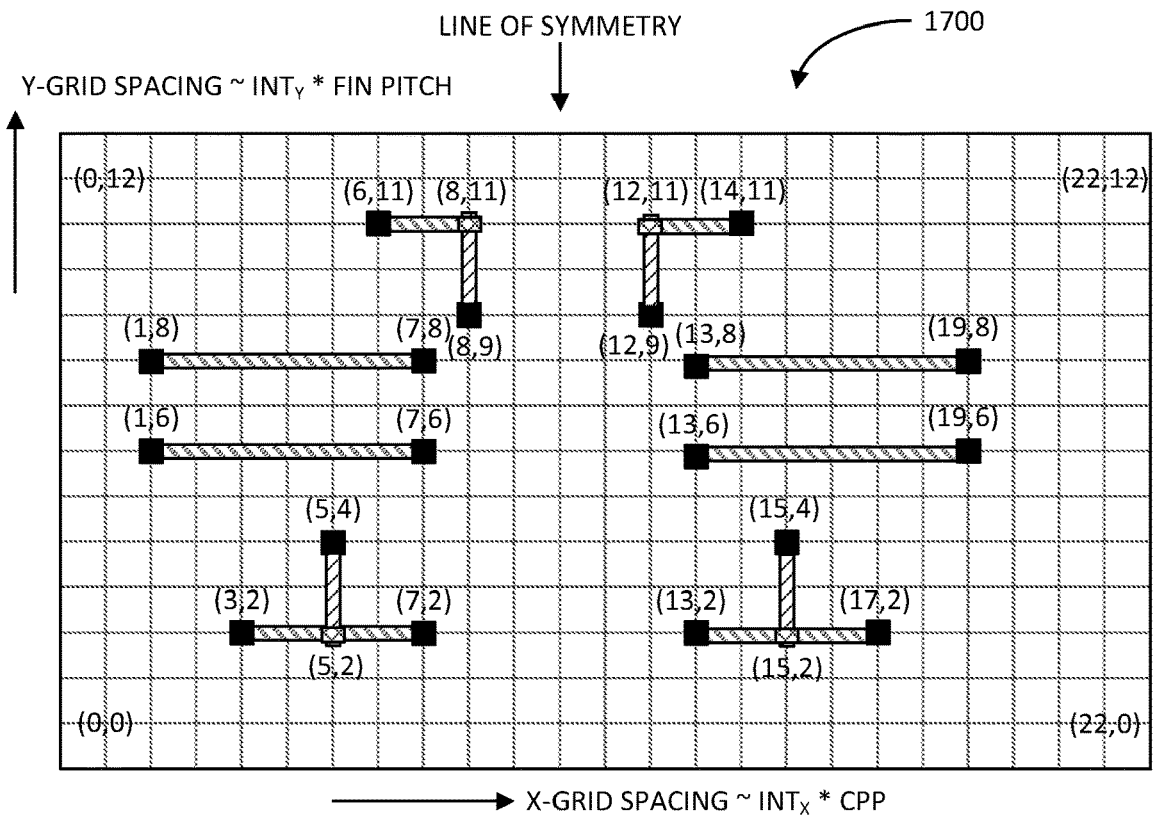

FIG. 17A-17C illustrate diagrams of an exemplary interconnect routing coordinate system 1700 in accordance with another aspect of the disclosure. As discussed above with the layout 1600, the width of the layout is a multiple integer of the poly pitch (CPP), and the height of the layout is another multiple integer of the fin pitch (FP). Additionally, the x- and y-locations of the cells of the layout 1600 in a Cartesian coordinate system are based on an integer multiple of the poly pitch (CPP) and fin pitch (FP). Thus, metal interconnect routing between cells may also be based on such a Cartesian coordinate system. Accordingly, the interconnect routing coordinate system 1700 depicted is based on a Cartesian coordinate system, which facilitates metal interconnect routing between cells.

With particular reference to FIG. 17A, the interconnect routing coordinate system 1700 includes a two-dimensional array of grids. The spacing of each grid in the horizontal or x-direction is related to an integer $INT_X$ multiplied by the poly pitch (CPP). The spacing of each grid in the vertical or y-direction is related to an integer $INT_Y$ multiplied by the fin pitch (FP). By "related" means that the grid spacing is a function of an integer multiple of the fin pitch (FP) and the poly pitch (CPP). For example, an analog cell may have a height of 16 fins multiplied by 27 nm fin pitch, i.e., 432 nm. The analog cell may have six (6) M3 traces per cell, which results in an M3 pitch of 432 nm/6, i.e., 72 nm. 72 nm is not an integer multiple of the fin pitch (FP), but is related to the fin pitch by a ratio being 16/6, e.g., the number of fins divided by the number of M3 traces. However, it shall be understood that the ratio may also be one (1) so that the grid spacing is an integer multiple of the fin pitch (FP). This also applies to the poly pitch (CPP).

In this example, the upper-right corner of the bottom-left grid may be assigned coordinate (0,0). The lower-right corner of the top-left grid may be assigned coordinate (0,12). The upper-left corner of the bottom-right grid may be assigned coordinate (22,0). And, the lower-left corner of the top-right grid may be assigned coordinate (22,12).

The interconnect routing coordinate system 1700 includes a set of black squares at the corners of various grids. The black squares represent contacts to analog transistor-based leaf cells located within the interconnect routing coordinate system. For example, as illustrated, there are contacts at coordinates (1,6), (1,8), (3,2), (5,4), (6,11), (7,2), (7,6), (7,8), (8,9), (12,9), (13,2), (13,6), (13,8), (14,11), (15,4), (17,2), (19,6), and (19,8).

With reference to FIG. 17B, an example of a metal interconnect routing is illustrated to exemplify the advantages of the interconnect routing coordinate system 1700. In this example, the metal interconnect routing electrically connects the cell contact at (8,9) to the cell contact at (6,11). According to the coordinate-based routing methodology, a first metal interconnect extends vertically along a particular metal layer (e.g., M4) from cell contact at (8,9) to coordinate (8,11). A second metal interconnect extends horizontally along another metal layer (e.g., M5) from coordinate (8,11) to cell contact at (6,11). A via contact is then dropped at coordinate (8,11) to electrically connect the first and second metal interconnects. Interconnect drawing or routing commands may be sequentially written as described above. As illustrated, the length of the vertical metal interconnect is related to an integer multiple of the fin pitch, and the length of the horizontal metal interconnect is related to an integer multiple of the poly pitch (CPP).

With reference to FIG. 17C, an example of horizontal and vertical metal interconnects electrically connecting the contacts of the analog leaf cells (e.g., transistor-based and/or passive) are shown. For example, as discussed above, the metal routing includes horizontal metal interconnects electrically connecting cell contacts at (3,2) to (7,2), (1,6) to (7,6), (1,8) to (8,9), (13,2) to (17,2), (13,6) to (19,6), and (13,8) to (19,8). The metal routing further includes horizontal metal interconnects electrically connecting cell contact at (6,11) to via contact at (8,11), and cell contact at (14,11) to a via contact at (12,11).

The metal routing further includes vertical metal interconnect electrically connecting cell contact at (5,4) to via contact at (5,2), cell contact at (8,9) to via contact at (8,11), cell contact at (15,4) to via contact at (15,2), and cell contact at (12,9) to via contact at (12,11). These horizontal and metal interconnects including associated vias may be written in a script identifying each of the interconnects and vias. As many circuit layouts are symmetrical about an axis, a short-cut in a routing script may include a symmetry or mirror command eliminating the need to specifically identify all the metal interconnects and vias. For example, the cell contacts, metal interconnects, and via contacts to the right of vertical line X=10 is a mirror of the same to the left of the X=10 line. Thus, only cell contacts, metal interconnects, and via contacts on one side of the symmetry line may be individually identified in a script, and a symmetry command in the script may be used to collectively identify the cell contacts, metal interconnects, and via contacts on the other side of the symmetry line.

Figure 18A:
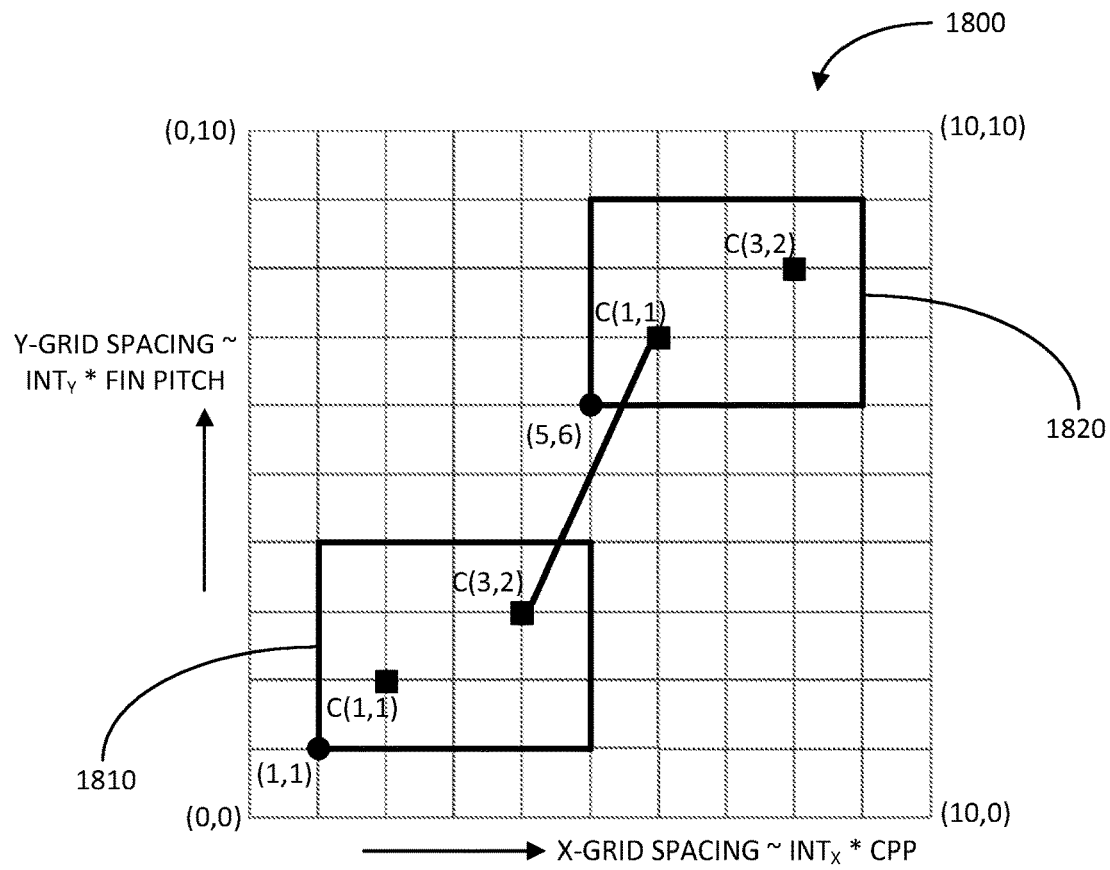
FIG. 18A-18E illustrate diagrams of another exemplary interconnect routing coordinate system in accordance with another aspect of the disclosure.

FIG. 18A-18E illustrate diagrams of another exemplary interconnect routing coordinate system 1800 in accordance with another aspect of the disclosure. With particular reference to FIG. 18A, the interconnect routing coordinate system 1800 identifies two analog leaf cells 1810 and 1820 (e.g., transistor-based and/or passive). The analog leaf cell 1810 is situated at a row of cells (others not shown) between Y positions 1 and 4. The analog leaf cell 1820 is situated at another row of cells (others not shown) between Y positions 6 and 9. The horizontal placement of the analog leaf cell 1810 is between X positions 1 and 5. The horizontal placement of the analog leaf cell 1820 is between X positions 5 and 9.

The analog leaf cell 1810 includes contacts at internal positions C(1,1) and C(3,2) with reference to an internal reference point at lowest-left corner of the cell. These internal contact positions C(1,1) and C(3,2) translates to coordinates (2,2) and (4,3) in the routing coordinate system 1800, respectively. Similarly, the analog leaf cell 1820 includes contacts at internal positions C(1,1) and C(3,2) with reference to an internal reference point at lowest-left corner of the cell. These internal contact positions C(1,1) and C(3,2) translates to coordinates (6,7) and (8,8) in the routing coordinate system 1800, respectively. In this example, there is a need to electrically connect the contact at (4,3) of analog leaf cell 1810 to the contact at (6,7) of the analog leaf cell 1820.

Figure 18B:
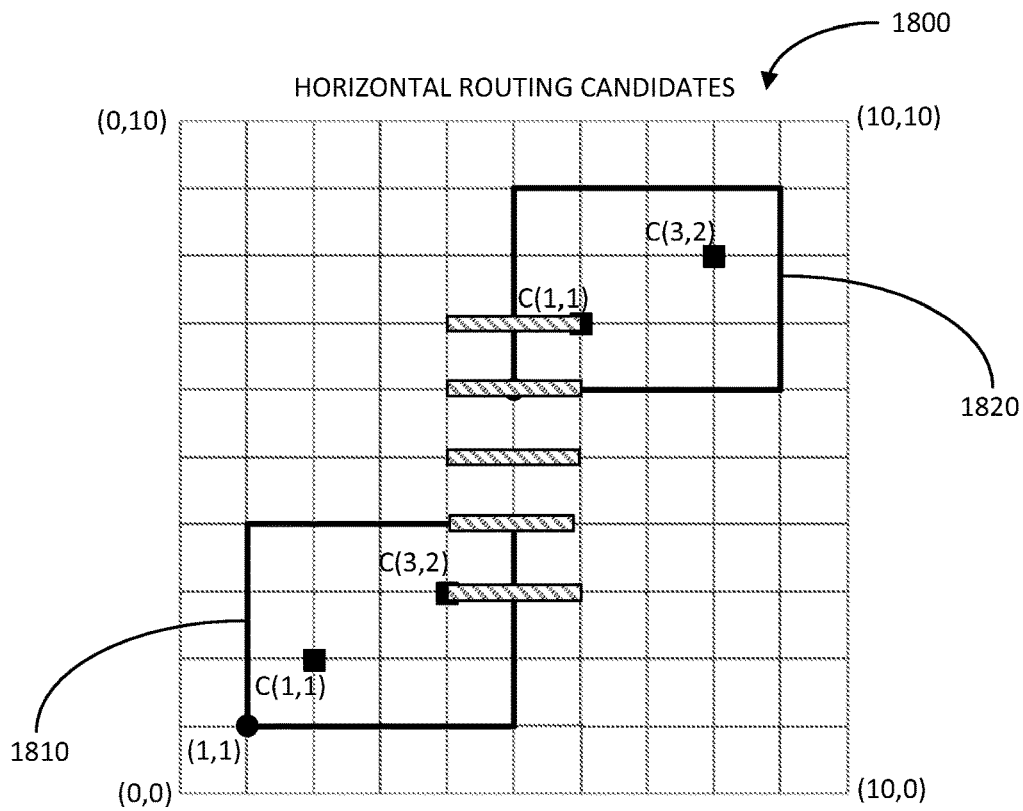

With reference to FIG. 18B, a set of candidate horizontal metal interconnects are identified for electrically connecting the contact at (4,3) of analog leaf cell 1810 to the contact at (6,7) of the analog leaf cell 1820. The candidates horizontal metal interconnects extend from and to the following coordinate pairs: (4,3)-(6,3), (4,4)-(6,4), (4,5)-(6,5), (4,6)-(6,6), and (4,7)-(6,7).

Figure 18C:
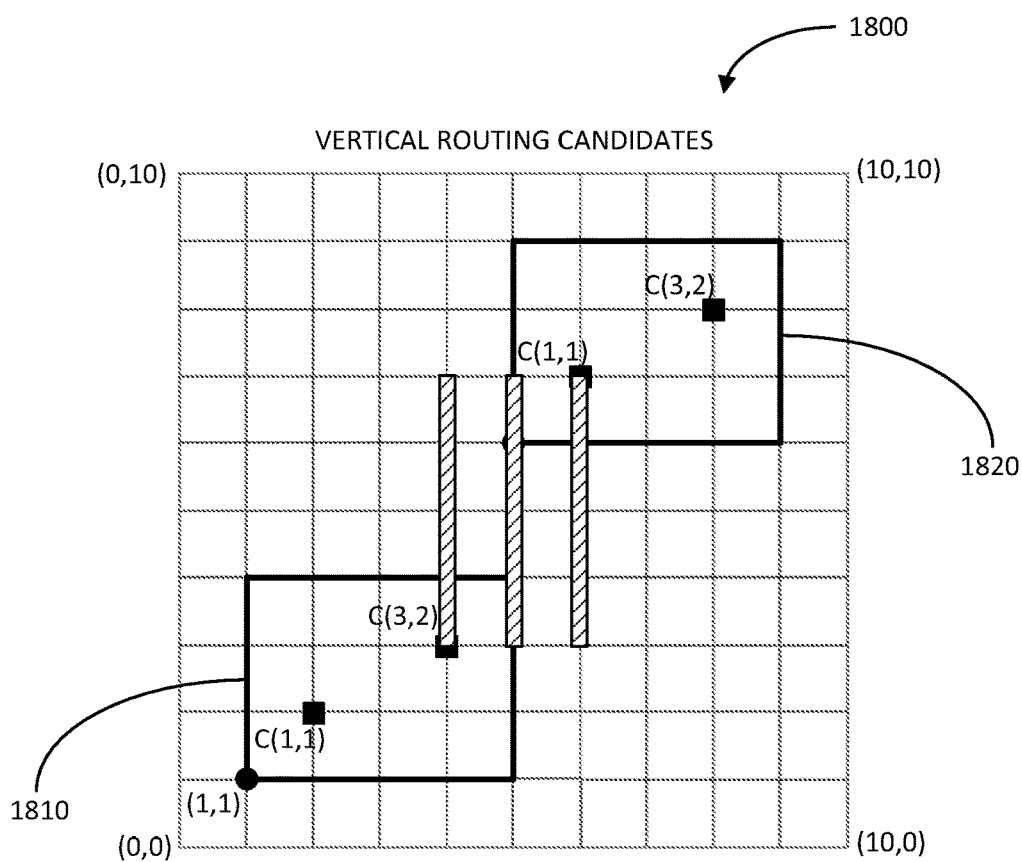

With reference to FIG. 18C, a set of candidate vertical metal interconnects are identified for electrically connecting the contact at (4,3) of analog leaf cell 1810 to the contact at (6,7) of the analog leaf cell 1820. The candidates vertical metal interconnects extend from and to the following coordinate pairs: (4,3)-(4,7), (5,3)-(5,7), and (6,3)-(6,7).

Figure 18D:
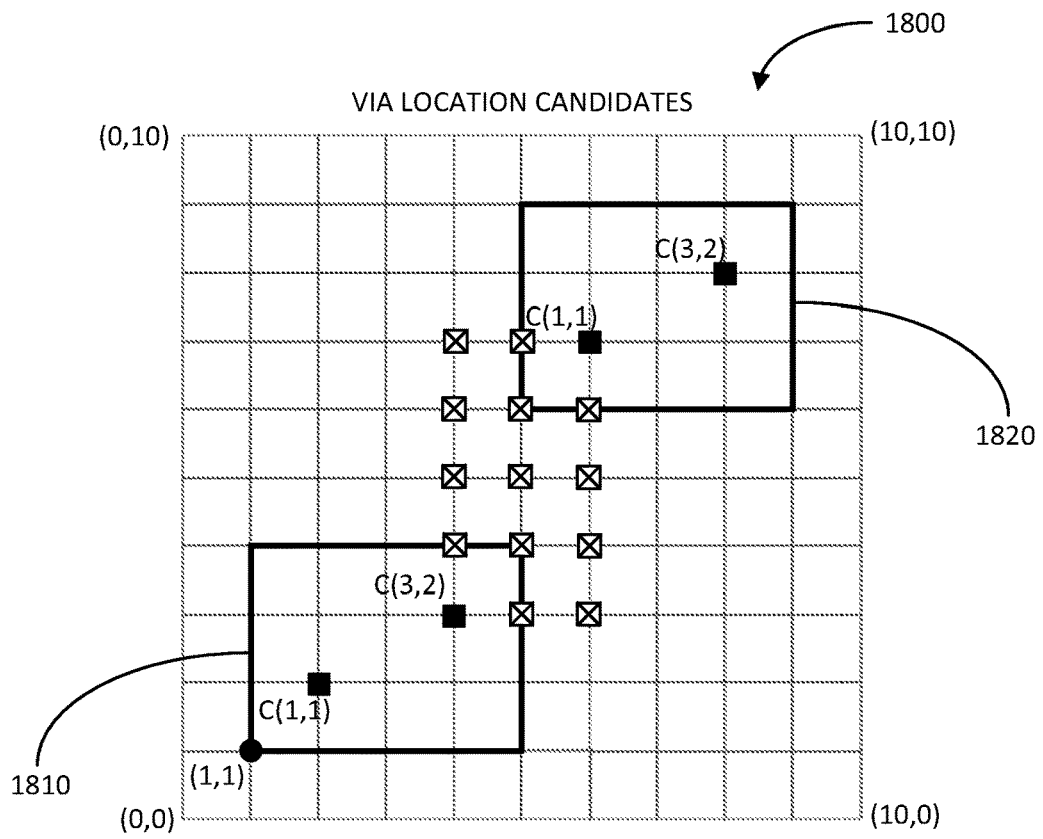

With reference to FIG. 18D, based on the set of candidate horizontal and vertical metal interconnects, a set of candidate vias are identified for electrically connecting the contact at (4,3) of analog leaf cell 1810 to the contact at (6,7) of the analog leaf cell 1820. The candidates vias at coordinates (5,3), (6,3), (4,4), (5,4), (6,4), (4,5), (5,5), (6,5), (4,6), (5,6), (6,6), (4,7), and (5,7).

Figure 18E:
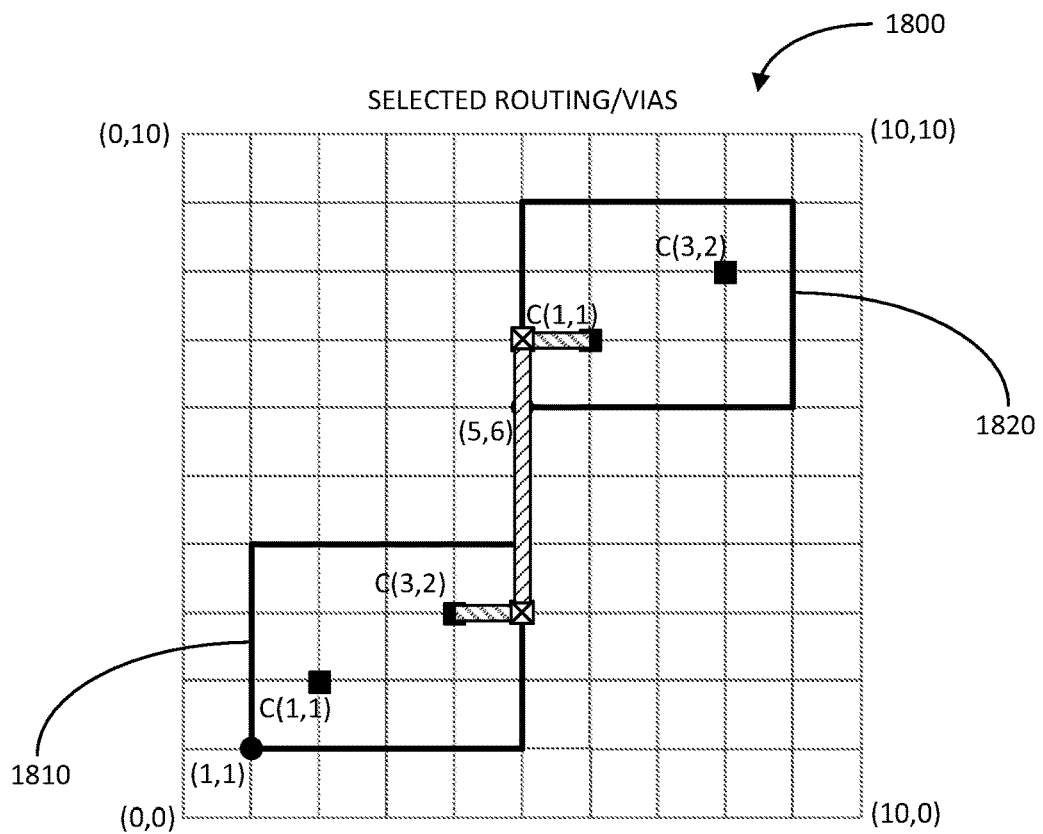

With reference to FIG. 18E, the selected metal interconnects and vias among the candidates are identified. The routing includes horizontal metal interconnects on a particular metal layer (e.g., M5) extending from (4,3) to (5,3), and from (5,7) to (6,7). The routing includes vertical metal interconnect on another metal layer (e.g., M4) extending from (5,3) to (5,7). Additionally, the routing includes via contacts at (5,3) and (5,7).

As can be seen, the use of the interconnect routing coordinate systems 1700 and 1800 facilitate the placement and routing between analog leaf cells based on coordinate grids, each grid having a first (e.g., horizontal) dimension being a multiple of the poly pitch (CPP), and a second (e.g., vertical) orthogonal dimension being a multiple of the fin pitch (FP).

Figure 19:
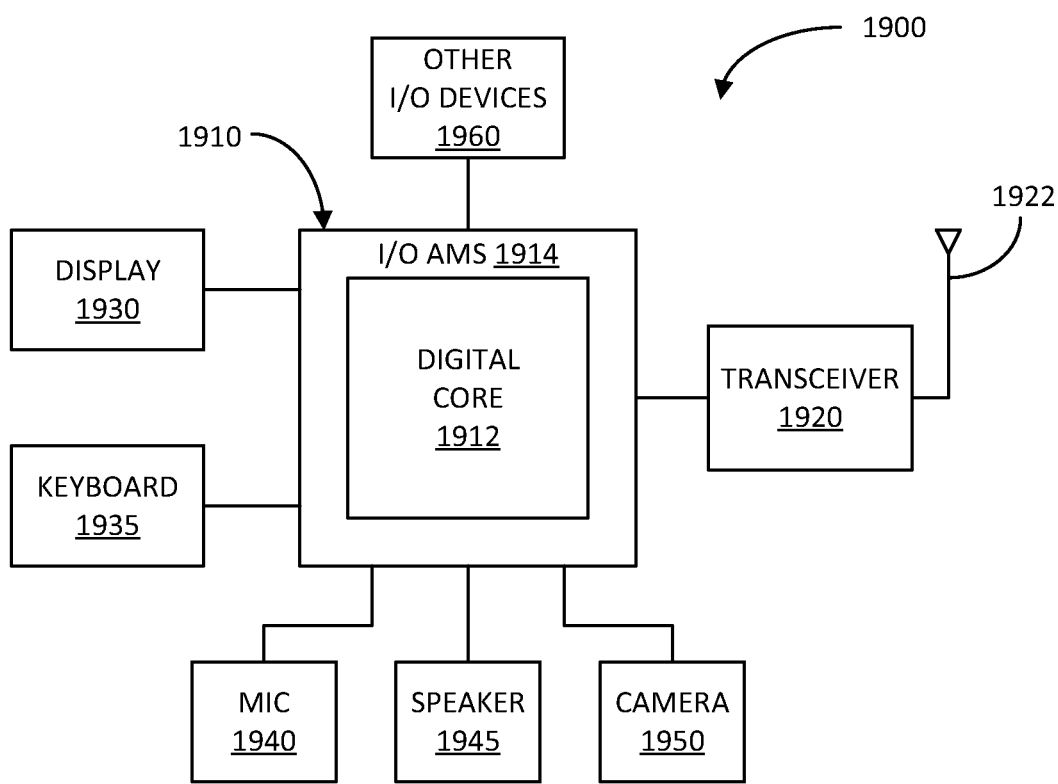
FIG. 19 illustrates a block diagram of an exemplary wireless device in accordance with another aspect of the disclosure.

FIG. 19 illustrates a block diagram of an exemplary wireless device 1900 in accordance with another aspect of the disclosure. The wireless device 1900 may be any type of wireless device, such as a smart phone, WiFi router, WiFi-compatible device, Bluetooth device, or other type of wireless device. In the example provided herein, the wireless device 1900 may be configured as a smart phone.

The wireless device 1900 includes an integrated circuit (IC) 1910, which may be configured as a system-on-chip (SOC). The IC 1910 may be configured similar to the SOC IC 200 previously discussed in detail. In particular, the IC 1910 includes a digital core 1912 for performing the various digital operations of the IC, and may be physically located or laid out centrally within the IC. The IC 1910 further includes an analog-mixed signal (AMS) section 1914 for performing the various analog, I/O, digital-to-analog and analog-to-digital conversion operations, and may be physically located or laid out along the periphery of the IC surrounding the digital core 1912. The AMS section 1914 includes the analog leaf cells, arrangement thereof, and interconnection thereof, as previously discussed in detail herein.

The wireless device 1900 further includes various peripheral devices that interface with the SOC IC 1910. The peripheral devices include devices for wireless signal transmission and reception, such as transceiver 1920 and associated antenna 1922. It shall be understood that the transceiver 1920 and antenna 1922 may include a set of transceiver chains and an associated set of antenna elements for directionally transmitting and receiving signals, such as in beamforming, and multiple-input-multiple-output (MIMO) operations. The transceiver 1920 is coupled to the I/O AMS section 1914 of the SOC IC 1910 for providing receive signals and receiving transmit signals to and from the I/O AMS section, respectively.

Other peripheral devices include devices for interfacing a user with the various operations performed by the SOC IC 1910. For example, the wireless device 1900 includes a keyboard 1935 and a display 1930 for providing and receiving user information to and from the digital core 1912 of the SOC IC 1910 via the I/O AMS 1914, respectively. It shall be understood that the display 1930 and the keyboard 1935 may be integrated, such as in a touchscreen display. Additional peripheral devices include a microphone 1940 and a speaker 1945 for providing and receiving audio data to and from the digital core 1912 of the SOC IC 1910 via the I/O AMS 1914, respectively.

Similarly, another peripheral device includes a camera 1950 for providing video and still-picture data to the digital core 1912 of the SOC IC 1910 via the I/O AMS 1914, respectively. As a catchall, the wireless device 1900 may further include other I/O devices 1960 that interface with the SOC IC 1910, including hard buttons (e.g., on/off switch, home button, volume control, etc.), ports (e.g., Universal Serial Bus (USB) port, subscriber identify module (SIM) port, etc.), as well as other devices.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An integrated circuit, comprising:
   a transistor-based cell comprising a set of fin field effect transistors (Fin FETs) chained together in a first direction, wherein the set of Fin FETs include fins extending longitudinally along the first direction and equally-spaced apart in a second direction orthogonal to the first direction by a fin pitch, and a set of polysilicon gates extending longitudinally along the second direction and equally-spaced apart in the first direction by a poly pitch, wherein a first dimension of the transistor-based cell along the first direction is substantially a first integer multiplied by the poly pitch, and wherein a second dimension of the transistor-based cell along the second direction is substantially a second integer multiplied by the fin pitch; and
   a passive-device based cell including a passive device, wherein a third dimension of the passive-based cell along the first direction is substantially a third integer multiplied by the poly pitch, and wherein a fourth dimension of the passive-based cell along the second direction is substantially a fourth integer multiplied by the fin pitch.

2. The integrated circuit of claim 1, wherein the set of Fin FET are configured to form a differential transistor pair.

3. The integrated circuit of claim 1, wherein the transistor-based cell includes metal interconnects to configure the set of Fin FETs to form at least two independent drain connections, at least two independent gate connections, and a common source connection.

4. The integrated circuit of claim 1, wherein the set of Fin FET are configured to form a pair of stacked Fin FETs.

5. The integrated circuit of claim 1, wherein the transistor-based cell includes metal interconnects to configure the set of Fin FETs to form a pair of stacked Fin FETs with a single or redundant drain connection, a single or redundant source connection, and a single or redundant gate connection.

6. The integrated circuit of claim 1, wherein the set of Fin FET are configured to form a stack of at least two (2) Fin FETs.

7. The integrated circuit of claim 1, wherein the transistor-based cell includes metal interconnects to configure the set of Fin FETs to form a stack of at least four Fin FETs with a single or redundant drain connection, a single or redundant source connection, and a single or redundant gate connection.

8. The integrated circuit of claim 1, wherein the transistor-based cell is configured as a dummy cell.

9. The integrated circuit of claim 1, wherein the transistor-based cell includes metal interconnects to configure the set of Fin FETs to form a floating gate connection and a common source/drain connection.

10. The integrated circuit of claim 9, wherein the common source/drain connection is electrically coupled to an upper voltage rail or a lower voltage rail.

11. The integrated circuit of claim 1, wherein the transistor-based cell includes metal interconnects to configure the set of Fin FETs to form a stack of at least three Fin FETs including a single or redundant drain connection and a single or redundant source connection, wherein at least two of the stacked Fin FETs include a first gate connection, and at least the other stacked Fin FET has a second gate connection independent of the first gate connection.

12. The integrated circuit of claim 11, wherein the second gate connection is configured to receive an enable signal or a cascode bias voltage.

13. The integrated circuit of claim 1, wherein the passive device comprises a resistor or capacitor.

14. The integrated circuit of claim 1, wherein the transistor-based cell is configured as a foot switch or a head switch.

15. The integrated circuit of claim 1, wherein the transistor-based cell includes metal interconnects to configure the set of Fin FETs to form at least a stacked pair of the Fin FETs with a common gate connection, a pair of source connections, and a drain connection, a first dummy Fin FET coupled to one of the source connection, and a second dummy Fin FET coupled to the other source connection.

16. An integrated circuit, comprising a first row of transistor-based cells extending in a first direction, wherein each of the transistor-based cells includes a set of fin field effect transistors (Fin FETs) chained together in the first direction, wherein the set of Fin FETs include fins extending longitudinally in the first direction and equally-spaced apart in a second direction orthogonal to the first direction by a fin pitch, and a set of polysilicon gates extending longitudinally in the second direction and equally-spaced apart in the first direction by a poly pitch, wherein a first dimension of each of the transistor-based cells in the first direction is substantially a first integer multiplied by the poly pitch, and wherein a second dimension of each of the transistor-based cells in the second direction is substantially a second integer multiplied by the fin pitch, wherein the first row of transistor-based cells comprises:
- a first set of one or more transistor-based cells including a first source connection;
- a second set of one or more transistor-based cells including a second source connection independent of the first source connection; and
- a break cell configured to electrically isolate the first source connection from the second source connection, wherein the first set of one or more transistor-based cells, the second set of one or more transistor-based cells, and the break cell are formed over a continuous diffusion region.

17. The integrated circuit of claim 16, wherein the transistor-based cells of the first row include at least one operational cell situated between at least two dummy cells.

18. The integrated circuit of claim 16, wherein the first row further includes a pair of endcaps, wherein the transistor-based cells are situated between the pair of endcaps.

19. The integrated circuit of claim 16, wherein the break cell comprises:
- a first source/drain connection electrically coupled to the first source connection;
- a second source/drain connection electrically coupled to the second source connection; and
- a gate connection electrically coupled to an upper or lower voltage rail.

20. The integrated circuit of claim 16, further comprising a second row of transistor-based cells extending in the first direction, wherein each of the transistor-based cells of the second row includes a set of Fin FETs chained together in the first direction, wherein the set of Fin FETs include fins longitudinally extending in the first direction and equally-spaced apart in the second direction by the fin pitch, and a set of polysilicon gates extending longitudinally in the second direction and equally-spaced apart in the first direction by the poly pitch, wherein a third dimension of each of the transistor-based cells of the second row in the first direction is substantially a third integer multiplied by the poly pitch, and wherein a fourth dimension of each of the transistor-based cells in the second direction is substantially a fourth integer multiplied by the fin pitch.

21. The integrated circuit of claim 20, wherein the first row includes opposite ends that substantially align in the first direction with opposite ends of the second row.

22. The integrated circuit of claim 21, further comprising:
- a third row including a top cap situated between a pair of top corner cells, wherein the third row includes opposite ends that substantially align with the respective opposite ends of the first and second rows in the first direction; and
- a fourth row including a bottom cap situated between a pair of bottom corner cells, wherein the fourth row includes opposite ends that substantially align with the respective opposite ends of the first and second rows in the first direction.

23. An integrated circuit, comprising a first row of transistor-based cells extending in a first direction, wherein each of the transistor-based cells includes a set of fin field effect transistors (Fin FETs) chained together in the first direction, wherein the set of Fin FETs include fins extending longitudinally in the first direction and equally-spaced apart in a second direction orthogonal to the first direction by a fin pitch, and a set of polysilicon gates extending longitudinally in the second direction and equally-spaced apart in the first direction by a poly pitch, wherein a first dimension of each of the transistor-based cells in the first direction is substantially a first integer multiplied by the poly pitch, and wherein a second dimension of each of the transistor-based cells in the second direction is substantially a second integer multiplied by the fin pitch; and a thin-film resistor cell including a first dimension in the first direction being substantially a third integer multiplied by the poly pitch, and a second dimension in the second direction being substantially a fourth integer multiplied by the fin pitch.

24. An integrated circuit, comprising a first row of transistor-based cells extending in a first direction, wherein each of the transistor-based cells includes a set of fin field effect transistors (Fin FETs) chained together in the first direction, wherein the set of Fin FETs include fins extending longitudinally in the first direction and equally-spaced apart in a second direction orthogonal to the first direction by a fin pitch, and a set of polysilicon gates extending longitudinally in the second direction and equally-spaced apart in the first direction by a poly pitch, wherein a first dimension of each of the transistor-based cells in the first direction is substantially a first integer multiplied by the poly pitch, and wherein a second dimension of each of the transistor-based cells in the second direction is substantially a second integer multiplied by the fin pitch; and a capacitor cell including a first dimension in the first direction being substantially a third integer multiplied by the poly pitch, and a second dimension in the second direction being substantially a fourth integer multiplied by the fin pitch.

\* \* \* \* \*